US006933155B2

(12) United States Patent
Albert et al.

(10) Patent No.: US 6,933,155 B2
(45) Date of Patent: Aug. 23, 2005

(54) METHODS FOR PROVIDING A SUB .15 MICRON MAGNETIC MEMORY STRUCTURE

(75) Inventors: Frank Albert, Redwood City, CA (US); Yiming Huai, Pleasanton, CA (US); Paul P. Nguyen, San Jose, CA (US)

(73) Assignee: Grandis, Inc., Milpitas, CA (US)

( * ) Notice: Subject to any disclaimer, the term of this patent is extended or adjusted under 35 U.S.C. 154(b) by 101 days.

(21) Appl. No.: 10/443,936

(22) Filed: May 21, 2003

(65) Prior Publication Data

US 2004/0235201 A1 Nov. 25, 2004

(51) Int. Cl.[7] .............................................. H01L 21/00
(52) U.S. Cl. .......................................... 438/3; 438/257
(58) Field of Search ........................... 438/3, 257–259; 257/310, 421; 365/158, 173

(56) References Cited

U.S. PATENT DOCUMENTS

| 2002/0105827 A1 | 8/2002 | Redon et al. ............... 365/173 |
| 2003/0007398 A1 | 1/2003 | Daughton et al. .......... 365/200 |
| 2003/0059588 A1 | 3/2003 | Hannah et al. ............. 428/200 |
| 2004/0014245 A1 * | 1/2004 | Motoyoshi ...................... 438/3 |

OTHER PUBLICATIONS

J.F. Albert, et al, "Polarized Current Switching of a CO Thin Film Nanomagnet", American Institute of Physics, vol. 77, No. 23, Dec. 4, 2000, pp. 3809–3811.
J.A. Katine, et al, "Current–Driven Magnetization Reversal and Spin–Wave Excitations in Co/Cu/Co Pillars", the American Physical Society, vol. 84, No. 14, Apr. 3, 2000, pp. 3149–3151.
E.G. Myers, et al, "Point–Contact Studies of Current–Controlled Domain Switching in Magnetic Multilayers" Journal of Applied Physics, vol. 87, No. 9, May 1, 2000, pp. 5502–5503.
J.C. Slonczewski, "Theory and Application of Exchange–Driven Switching", IEEE, Apr. 2000, pp. CE–02.
J.C. Slonczewski, "Current–Driven Excitation of Magnetic Multilayers", Journal of Magnetism and Magnetic Materials, 1996, pp. 1.1–1.7.
J.C. Slonczewski, "Conductance and Exchange Coupling of Two Ferromagnets Separated by a Tunneling Barrier", The American Physical Society, vol. 39, No. 10, Apr. 1, 1999, pp. 6995–7002.
J.Z. Sun, "Current–Driven Magnetic Switching in Manganite Trilayer Junctions", Journal of Magnetism and Magnetic Materials, No. 202, 1999, pp. 157–162.
Daughton, et al., Patent Publication US2003/0007398 dated Jan. 9, 2003 Figures 3, 4, 5A; Paragraphs 60, 61, 67,68.

* cited by examiner

*Primary Examiner*—Dung A. Le
(74) *Attorney, Agent, or Firm*—Sawyer Law Group LLP

(57) ABSTRACT

A method for providing a magnetic element is disclosed. The method includes providing at least one magnetic element layer and providing a hard mask structure for masking a portion of the at least one magnetic element layer. The hard mask structure is made from hard mask material(s) that are etchable for defining the hard mask structure. The hard mask structure also acts as a mask during definition of a width of the magnetic element. The method also includes defining the width of the magnetic element by removing a portion of the at least one magnetic element layer using the hard mask structure as a mask. The hard mask structure preferably acts as a polishing stop for a planarization step, such as a chemical mechanical polish, polishing resistant structures might be provided to improve planarization of a magnetic memory incorporating the magnetic element.

13 Claims, 20 Drawing Sheets

METHODS FOR PROVIDING A SUB .15 MICRON MAGNETIC MEMORY STRUCTURE

CROSS-REFERENCE TO RELATED APPLICATIONS

The present application is related to U.S. patent application Ser. No. 10/231,430 entitled "Off-Axis Pinned Layer Magnetic Element Using Spin Transfer and an MRAM Device Using the Magnetic Element" filed on Aug. 28, 2002, and assigned to the assignee of the present application. The present application is related to U.S. patent application Ser. No. 10/213,537 entitled "Magnetic element utilizing Spin Transfer and an MRAM Device Using the Magnetic Element," filed on Aug. 6, 2002, and assigned to the assignee of the present application. The present application is related to U.S. patent application Ser. No. 10/339,962 entitled "Magnetostatically Coupled Magnetic Elements Utilizing Spin Transfer and an MRAM Device Using the Magnetic Element," filed on Jan. 10, 2003, and assigned to the assignee of the present application. The present application is related to U.S. patent application Ser. No. 10/259,129 entitled "Thermally Stable Magnetic Element Utilizing Spin Transfer and an MRAM Device Using the Magnetic Element," filed on Sep. 27, 2002, and assigned to the assignee of the present application. The present application is related to U.S. patent application Ser. No. 10/377,689 entitled "Magnetostatically Coupled Magnetic Elements Utilizing Spin Transfer and an MRAM Device Using the Magnetic Element," filed on Feb. 28, 2003, and assigned to the assignee of the present application.

FIELD OF THE INVENTION

The present invention relates to magnetic systems, and more particularly to a method and system for providing a reduced-sized magnetic element, including but not limited to a magnetic element that employs a spin transfer effect in switching and that can be used in a magnetic memory such as magnetic random access memory ("MRAM").

BACKGROUND OF THE INVENTION

Various types of magnetic technology utilize magnetic elements for storing or reading data. For example, in conventional MRAM technology, the conventional magnetic element used is a spin tunneling junction. The spin tunneling junction includes a ferromagnetic pinned layer having a magnetization that is typically pinned by an antiferromagnetic ("AFM") layer. The spin tunneling junction also includes a ferromagnetic free layer separated from the pinned layer by an insulating barrier layer. The barrier layer is sufficiently thin to allow tunneling of charge carriers between the pinned layer and the free layer. Similarly, in conventional hard disk magnetic recording technology, the magnetic elements for magnetoresistive read heads include conventional magnetic elements, such as a spin valves. Spin valves include a ferromagnetic pinned layer having a magnetization that is typically pinned by an AFM layer. The spin valve also includes a ferromagnetic free layer separated from the pinned layer by a conductive, nonmagnetic spacer layer, such as Cu. The ferromagnetic pinned and free layers of the spin tunneling junction and spin valve may also by synthetic or composed of ferrimagnetic materials.

FIG. 1 depicts a high-level flow chart depicting of a conventional method 10 for forming a magnetic element, such as the spin valve and spin tunneling junction used in conventional MRAM and conventional magnetic recording technology. For clarity, only some steps in the conventional method 10 are described. For example, other structures such as contacts are not described or depicted. FIGS. 2A–2C depict the conventional magnetic element 50 during fabrication. Referring to FIGS. 1 and 2A–2C, the layers for the conventional magnetic element 50 are deposited, via step 12. For example, step 12 may include depositing a seed layer, an AFM layer, a pinned layer, a nonmagnetic spacer layer and a free layer. A bilayer photoresist structure is provided on the layers for the conventional magnetic element 50, via step 14.

FIG. 2A depicts the conventional magnetic element 50 during formation on a substrate 52. The conventional magnetic element 50 includes magnetic element layers 54. The magnetic element layers 54 might include an AFM layer, a pinned layer, a barrier layer or nonmagnetic spacer layer, and a free layer that are not explicitly shown. The magnetic element layers 54 might include other layers, such as capping layers, or other magnetic layers for example for dual spin valves or dual spin tunneling junctions. Also shown in the bilayer photoresist structure 56. The bilayer photoresist structure 56 includes a lower layer 58 and an upper layer 60 that extends past the edges of the lower layer 58.

Using the bilayer photoresist structure 56 as a mask, the magnetic element layers 54 are ion milled, via step 16. Step 16 thus defines the magnetic element 50. FIG. 2B depicts the magnetic element 50 after step 16 has been completed. Structures which are analogous to those depicted in FIG. 2A, such as the substrate 52, are labeled similarly. Thus, a portion of the magnetic layers 54' has been removed, leaving the magnetic element 50.

An insulator may then be provided, via step 18. During deposition of the insulator, the bilayer photoresist structure 56 masks the underlying magnetic element 50 from the insulator. The bilayer photoresist structure 56 is removed, via step 20. Processing of the magnetic element 50 is then completed, via step 22. FIG. 2C depicts the conventional magnetic element 50 after further processing. Consequently, the insulator 62 has been provided. Thus, the conventional method 10 can provide a conventional magnetic element 50.

Although the conventional method 10 and conventional magnetic element 50 function, one of ordinary skill in the art will readily recognize that the current trend in various types of magnetic technology is toward smaller magnetic elements. For example, in conventional MRAM technology, the trend is toward higher density memories and, therefore, smaller sizes of the magnetic element. Similarly, the trend in conventional hard disk magnetic recording is toward a higher density recording media having smaller bit sizes. Thus, the magnetic elements for read and write heads used in hard disk drives are also more compact. Consequently, the width, w depicted in FIGS. 2B and 2C, is desired to be smaller. In particular, for many applications, the width of the magnetic element 50 is desired to be 0.15 micron or less.

Although the conventional method 10 can be used to fabricate magnetic elements, one of ordinary skill in the art will readily recognize that the use of the conventional method 10 may not reliably fabricate smaller magnetic elements. Using the method 10, 0.12×0.22 micron structures may be fabricated from 0.248 micro photolithography. However, magnetic elements having a width of less than or equal to 0.15 micron may not be reliably fabricated using the conventional method 10. During fabrication, the bilayer photoresist structure 56 may not adequately mask the underlying magnetic element layers 54 at smaller widths. The portion of the upper layer 60 that overhangs the edges of the lower layer 58 may break off at lower widths. Moreover, the lower layer 58 may detach from the underlying magnetic element layers 54. Consequently, the magnetic element 50 does not have the desired size. In addition, the insulator 60 and other features fabricated on the magnetic element, such as contacts, will not be in the appropriate places. Thus, failures of the magnetic elements 50, as well as other structures, can result.

Accordingly, what is needed is a system and method for reliably fabricating magnetic elements having smaller widths. The present invention addresses such a need.

SUMMARY OF THE INVENTION

The present invention provides a method and system for providing a magnetic element. The method and system comprise providing at least one magnetic element layer and providing a hard mask structure for masking a portion of the at least one magnetic element layer. The hard mask structure is formed from at least one hard mask material that is etchable for definition of the hard mask structure. The hard mask structure also acts as a mask during definition of a width of the magnetic element. The method and system also comprise defining the width of the magnetic element by removing a portion of at least one magnetic element layer using the hard mask structure as a mask.

According to the system and method disclosed herein, the present invention provides a method for reliably fabricating a magnetic element having a smaller size, preferably below 0.15 um.

BRIEF DESCRIPTION OF THE DRAWINGS

FIG. 2B is a diagram of one embodiment of a magnetic element in which the free layers are magnetostatically coupled.

DETAILED DESCRIPTION OF THE INVENTION

Figure 1:
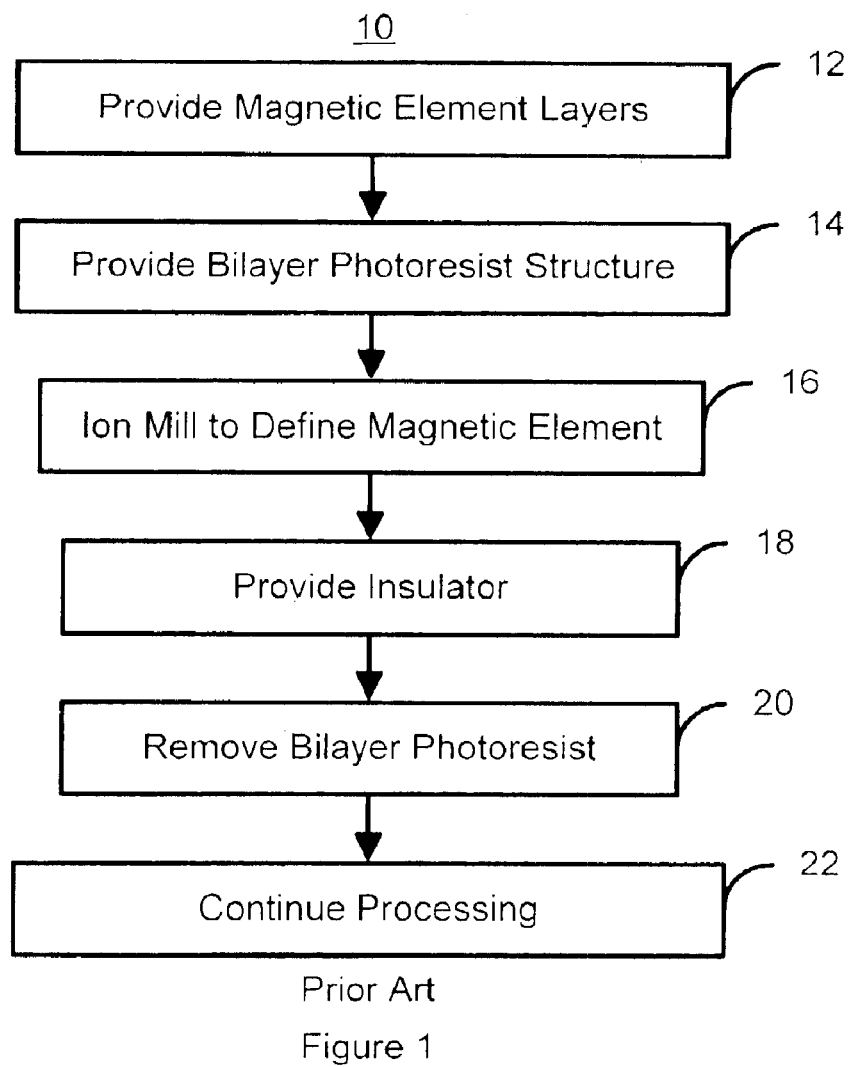
FIG. 1 is a flow chart depicting a conventional method for fabricating a conventional magnetic element.

The present invention relates to an improvement in the fabrication of magnetic elements. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

Conventional magnetic storage technology increasingly utilizes magnetic elements, such spin valves and spin tunneling junctions, that have a smaller size. However, manufacturing such elements using conventional fabrication methods is difficult. Furthermore, a more recently discovered phenomenon, known as spin transfer, is also of interest in magnetic storage technology. Current knowledge of spin transfer is described in detail in J. C. Slonczewski, "Current-driven Excitation of Magnetic Multilayers," *Journal of Magnetism and Magnetic Materials,* vol. 159, p. L1–L5 (1996); L. Berger, "Emission of Spin Waves by a Magnetic Multilayer Traversed by a Current," *Phys. Rev. B,* Vol. 54, p. 9353 (1996), and in F. J. Albert, J. A. Katine and R. A. Buhman, "Spin-polarized Current Switching of a Co Thin Film Nanomagnet," *Appl. Phys. Lett.,* vol. 77, No. 23, p. 3809–3811 (2000). Thus, the following description of the spin transfer phenomenon is based upon current knowledge in the area and is not intended to limit the scope of the invention.

The spin-transfer effect arises from the spin-dependent electron transparent properties of ferromagnetic-normal metal multilayers. When a spin-polarized current traverses a magnetic multilayer in a current perpendicular to the plane (CPP) configuration, the spin angular momentum of electrons incident on a ferromagnetic layer interacts with magnetic moments of the ferromagnetic layer near the interface between the ferromagnetic and normal-metal layers. Through this interaction, the electrons transfer a portion of their angular momentum to the ferromagnetic layer. As a result, a spin-polarized current can switch the magnetization direction of the ferromagnetic layer if the current density is sufficiently high (approximately $10^7$–$10^8$ A/cm$^2$), and if the dimensions of the multilayer are small (approximately less than two hundred nanometers) so that self field effects are not important. In addition, for spin transfer to be able to switch the magnetization direction of a ferromagnetic layer, the ferromagnetic layer must be sufficiently thin, for instance, preferably less than approximately ten nanometers for Co.

The phenomenon of spin transfer can be used in the CPP configuration as an alternative to or in addition to using an external switching field to switch the direction of magnetization of the free layer conventional spin valves or the conventional spin tunneling junctions. Spin transfer is a phenomenon which dominates other mechanisms and thus becomes observable when the dimensions of the conventional magnetic element are small, in the range of few hundred nanometers. In contrast to the application of an external field, the spin transfer phenomenon is a localized phenomenon. Thus, spin transfer may be used to write to magnetic elements in higher density magnetic memories having smaller magnetic elements.

One of ordinary skill in the art will readily recognize that there are barriers to using the phenomenon of spin transfer to write to conventional magnetic elements, such as spin valves or spin tunneling junctions. For the conventional spin valve, the CPP configuration results in a significantly reduced signal. Although a conventional spin tunneling junction may have a larger signal due to is larger resistance, the high current density required to induce the spin-transfer effect could destroy thin insulating barrier due to ohmic dissipation.

Magnetic elements which overcome these issues are described in U.S. patent application Ser. No. 10/231,430 entitled "Off-Axis Pinned Layer Magnetic Element Using Spin Transfer and an MRAM Device Using the Magnetic Element" filed on Aug. 28, 2002, and assigned to the assignee of the present application; U.S. patent application Ser. No. 10/213,537 entitled "Magnetic element utilizing Spin Transfer and an MRAM Device Using the Magnetic Element," filed on Aug. 6, 2002, and assigned to the assignee of the present application; U.S. patent application Ser. No. 10/339,962 entitled "Magnetostatically Coupled Magnetic Elements Utilizing Spin Transfer and an MRAM Device Using the Magnetic Element," filed on Jan. 10, 2003, and assigned to the assignee of the present application; U.S. patent application Ser. No. 10/259,129 entitled "Thermally Stable Magnetic Element Utilizing Spin Transfer and an MRAM Device Using the Magnetic Element," filed on Sep. 27, 2002, and assigned to the assignee of the present application; and U.S. patent application Ser. No. 10/377,689 entitled "Magnetostatically Coupled Magnetic Elements Utilizing Spin Transfer and an MRAM Device Using the Magnetic Element," filed on Feb. 28, 2003, and assigned to the assignee of the present application. Applicant hereby incorporates by reference the above-identified co-pending patent applications.

Figure 3A:
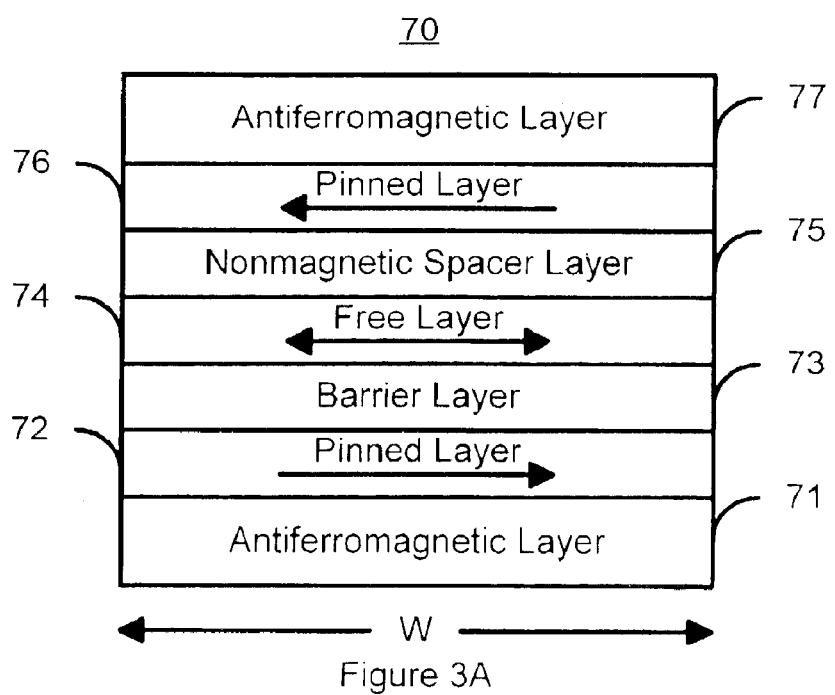
FIG. 3A is a diagram of one embodiment of a dual spin tunnel/valve structure used as a magnetic element.

FIG. 3A is a diagram of one embodiment of a magnetic element termed a dual spin tunnel/valve structure 70 that can be used as a magnetic element and that is described in the above-identified co-pending patent applications. The dual spin tunnel/valve structure 70 is preferably fabricated upon the appropriate seed layer. The dual spin tunnel/valve structure 70 includes an antiferromagnetic (AFM) layer 71 upon which a pinned layer 72 is fabricated. The pinned layer 72 is ferromagnetic and has its magnetization pinned by the AFM layer 71. The dual spin tunnel/valve structure 70 also includes a barrier layer 73 that is insulating and is thin enough to allow charge carriers to tunnel between the pinned layer 72 and the free layer 74. The free layer 74 is ferromagnetic and has a magnetization that can be changed due to the spin transfer phenomenon. The dual spin tunnel/valve structure 70 also includes a nonmagnetic spacer layer 75 that is conductive and can include materials such as Cu. The dual spin tunnel/valve structure 70 includes a second pinned layer 76 that is ferromagnetic and has a magnetization that is pinned by the AFM layer 77. The dual spin tunnel/valve structure 70 can be considered to be made up of a spin tunneling junction (including layers 71, 72, 73 and 74) and a spin valve (including layers 74, 75, 76, and 77), which share a free layer. Consequently, a higher read signal can be achieved while allowing writing using spin transfer. Although described as ferromagnetic, the layers 72, 74 and 76 may be ferrimagnetic, synthetic, and/or may be doped to improve the thermal stability of the dual spin tunnel/valve structure 70, as described in the above-identified patent application entitled "Thermally Stable Magnetic Element Utilizing Spin Transfer and an MRAM Device Using the Magnetic Element."

Figure 3B:
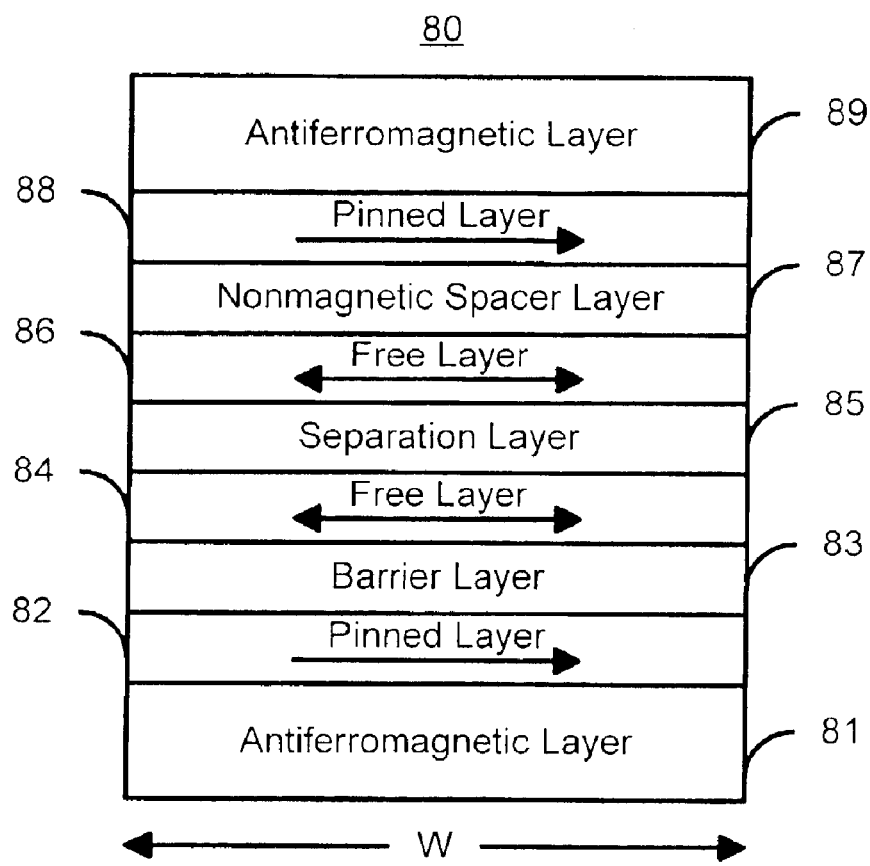

FIG. 3B is a diagram of one embodiment of a magnetic element 80 in which the free layers are magnetostatically coupled. The magnetic element 80 is preferably fabricated on the appropriate seed layer. The magnetic element 80 includes an AFM layer 81 upon which a pinned layer 82 is fabricated. The pinned layer 82 is ferromagnetic and has its magnetization pinned by the AFM layer 81. The magnetic element 80 also includes a barrier layer 83 that is insulating and is thin enough to allow charge carriers to tunnel between the pinned layer 82 and the free layer 84. The free layer 84 is ferromagnetic. The magnetic element 80 also includes a free layer 86 that is ferromagnetic and has a magnetization that can be changed due to the spin transfer phenomenon. Between the free layers 84 and 86 is a separation layer 85 that is used to ensure that the free layers 84 and 86 are free of indirect exchange coupling, and preferably spin transfer induced coupling, while being sufficiently thin to ensure that the free layers 84 and 86 are magnetostatically coupled. The free layers 84 and 86 are preferably coupled to be antiparallel. The magnetic element 80 also includes a nonmagnetic spacer layer 87 that is conductive and can include materials such as Cu. The magnetic element 80 includes a second pinned layer 88 that is ferromagnetic and has a magnetization that is pinned by the AFM layer 89. The dual spin tunnel/valve structure 80 can be considered to be made up of a spin tunneling junction (including layers 81, 82, 83 and 84) and a spin valve (including layers 86, 87, 88, and 89) having free layers that are magnetostatically coupled. The spin valve could also be a dual spin valve. Consequently, the free layer 86 of the spin valve can be written using spin transfer, which induces a particular magnetization in the free layer 84. The free layer 84 of the spin tunneling junction can be used to generate a higher read signal. Although described as ferromagnetic, the layers 82, 84, 86, and 88 may be ferrimagnetic, synthetic, and/or may be doped to improve the thermal stability of the magnetic element 80, as described in the above-identified patent application entitled "Thermally Stable Magnetic Element Utilizing Spin Transfer and an MRAM Device Using the Magnetic Element."

Figure 4A:
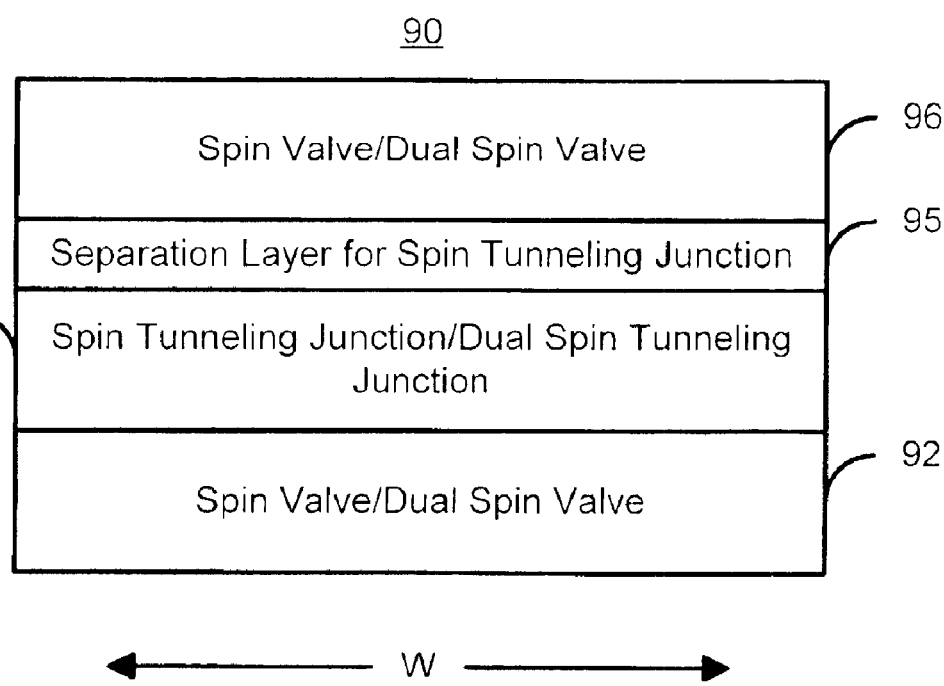
FIGS. 4A and 4B are diagrams of embodiments magnetic elements including dual spin tunnel/valve structures and magnetic elements having magnetostatically coupled free layers.
Figure 4B:
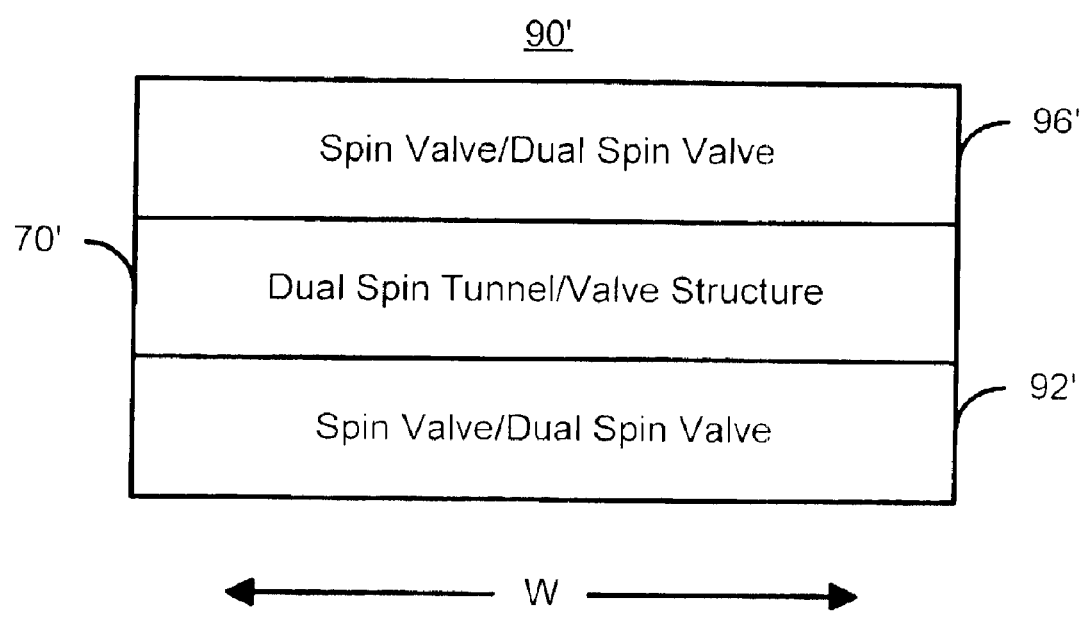

FIGS. 4A and 4B are diagrams of embodiments magnetic elements including spin tunnel/valve structures and magnetic elements having magnetostatically coupled free layers. FIG. 4A depicts a magnetic element 90 which includes a spin tunneling junction 94, which could be a single or dual spin tunneling junction. The spin tunneling junction 94 is, therefore, analogous to the spin tunneling junction of the magnetic element 80. The magnetic element 90 also includes spin valves 92 and 96, which have free layers (not explicitly shown) that are magnetostatically coupled to the free layer of the spin tunneling junction 94. Spin valves 92 and 96 could also be dual spin valves. In embodiments in which a spin tunneling junction, rather than a dual spin tunneling junction, is used in layer 94, then a separation layer 95 is provided. The separation layer ensures that the free layers (not explicitly shown) of the spin tunneling junction 94 and the spin valve 96 are not magnetically coupled except for magnetostatic coupling. Also in a preferred embodiment, the free layers of the spin tunneling junction 94 and free layers of the spin valves 92 and 96 are magnetostatically coupled.

FIG. 4B depicts one embodiment of a magnetic element 90' including a dual spin tunnel/valve structure 70' and dual spin valve(s) 96' and, optionally, 92'. The free layers of the dual spin tunnel/valve structure 70' and the dual spin valve (s) 92' and 96' are magnetostatically preferably coupled. Thus, the benefits of the magnetic elements 70 and 80 can be achieved.

Although the magnetic elements described in the above-identified co-pending applications function well for their intended purpose, one of ordinary skill in the art will also recognize that it is desirable to fabricate these elements at smaller sizes. For example, in certain embodiments, it is desirable for the width to be less than or equal to 0.15 micron to ensure that there is sufficient current density for the spin transfer phenomenon to write to these magnetic elements and without damaging the magnetic elements. Consequently, what is desired is a method for reliably fabricating these, and other, magnetic elements.

The present invention provides a method and system for providing a magnetic element. The method and system comprise providing at least one magnetic element layer and providing a hard mask structure for masking a portion of at least one magnetic element layer. The hard mask material is etchable for definition of the hard mask structure and also acts as a mask during definition of a width and depth (perpendicular to the plane of the page) of the magnetic element. The method and system also comprise defining the width and depth of the magnetic element by removing a portion of the at least one magnetic element layer using the hard mask structure as a mask.

The present invention will be described in terms of particular steps, particular magnetic elements, and certain materials. However, one of ordinary skill in the art will readily recognize that this method and system will operate effectively for other materials, other magnetic elements, and methods having additional and/or different steps not inconsistent with the present invention. Furthermore, the present invention is described in the context of a magnetic element utilizing the spin transfer phenomenon in order to write to the magnetic element. However, one of ordinary skill in the art will readily recognize that the method and system are consistent with other magnetic elements using other mechanisms to function. Furthermore, the present invention is described in conjunction with spin valves, dual spin valves, spin tunneling junctions, dual spin tunneling junctions, and dual spin tunnel/valve structures. However, one of ordinary skill in the art will readily recognize that the method and system are consistent with the use of combinations of these structures as well as magnetic elements having additional and/or other structures. In addition, the present invention is consistent with magnetic elements having simple and/or synthetic ferromagnetic and/or ferrimagnetic layers. Furthermore, although embodiments of the method in accordance with the present invention are described in the context of providing a single magnetic element, one of ordinary skill in the art will readily recognize that the method is consistent with providing multiple magnetic elements, for example in an array.

Figure 5A:
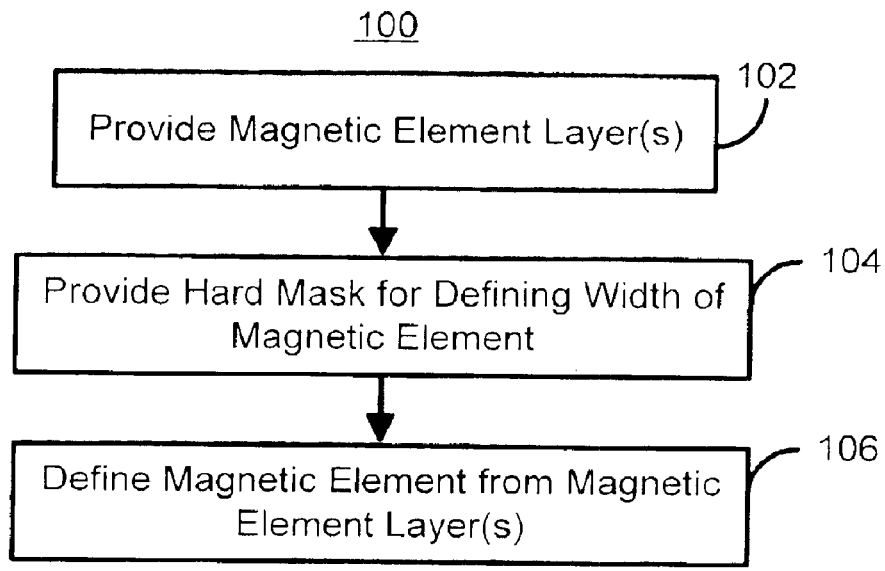
FIG. 5A is a high level flow chart of one embodiment of a method in accordance with the present invention for providing a magnetic element.

To more particularly illustrate the method and system in accordance with the present invention, refer now to FIG. 5A, depicting a high level flow chart of one embodiment of a method 100 in accordance with the present invention for providing a magnetic element that can have a reduced size. The magnetic element layers for the magnetic element are provided, via step 102. In a preferred embodiment, the magnetic layers are provided on a seed layer. Also in a preferred embodiment, the magnetic layers are for one or more of the magnetic elements 70, 80, 90, 90', a spin valve, a spin tunneling junction, or some combination thereof. The magnetic layers also preferably include a capping layer. A hard mask is provided on the magnetic layer(s), via step 104. In a preferred embodiment, the hard mask is provided on the capping layer. The capping layer is preferably configured to allow the hard mask to be provided with adversely affecting the layers under the capping layer. In a preferred embodiment, the capping layer makes it possible, in certain embodiments, to make good electrical contact to the top of the patterned magnetic structure without damaging the magnetic layers. The hard mask is etchable, preferably using an oxygen reactive ion etch. The capping layer is preferably not etchable using oxygen reactive ion etching. Therefore, the hard mask can be defined utilizing photolithography and oxygen reactive ion etching, using photoresist as a mask. The hard mask can also preferably act as a stop layer during a polishing step in that the polishing rate of the hard mask is smaller than the surrounding insulation. In the context of this application, the term polishing includes the removal of material by some mechanical and/or chemical process that can make the surface planar. Polishing, therefore, includes but is not limited to a chemical mechanical polishing (CMP). In a preferred embodiment, the hard mask preferably acts as a stop layer during a CMP step, in that the CMP rate of the hard mask is smaller than the surrounding insulation. Thus, during the planarization in a polishing step the polishing, or removal, rate will considerably slow upon uncovering the hard mask, allowing easier timing of the polishing step. The hard mask has a width and depth that is desired for the underlying magnetic element. In a preferred embodiment, the hard mask includes diamond-like carbon (DLC). Also in a preferred embodiment, the hard mask has a thickness of between approximately fifty to one thousand Angstroms. However, the hard mask might also include other suitable materials. In a preferred embodiment, the hard mask is has a width, $\lambda'$, that is equal to the minimum feature size of conventional photolithography. This minimum feature size may be less than the wavelength, $\lambda$, used in conventional photolithography due to the use of feature size reduction techniques such as over exposure or the use of phase shifted masks. The depth of the hard mask may be larger than $\lambda'$ in order to give the magnetic element a shape anisotropy. Also in a preferred embodiment, the width and depth of the hard mask is less than 0.15 micron. The width and depth of the magnetic element are defined using the hard mask as a mask, via step 106. Thus, the pattern of the hard mask is transferred to the underlying magnetic element layer(s) in step 106. In a preferred embodiment, step 106 is performed using an ion mill step.

Figure 2A:
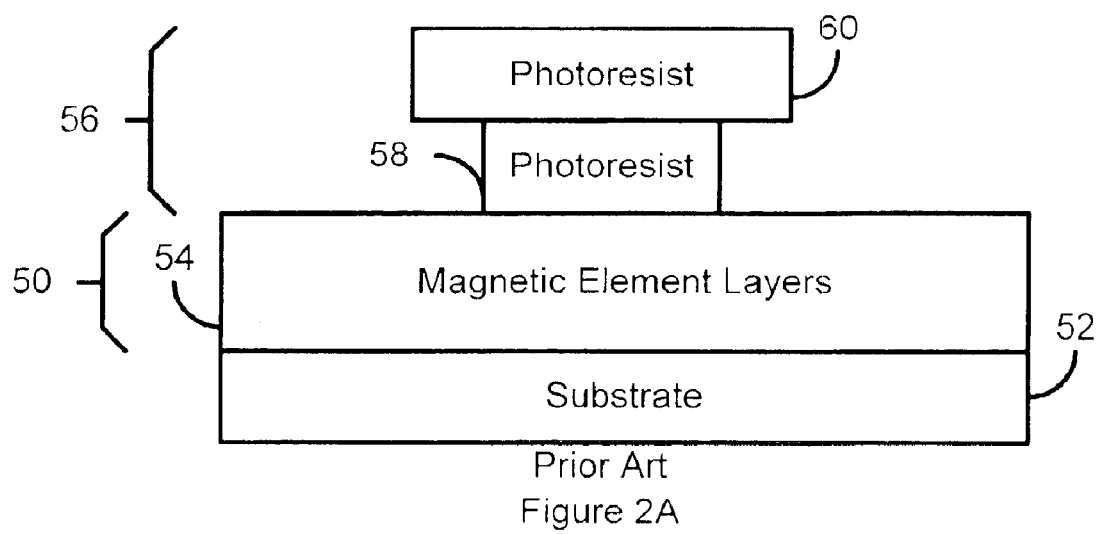
FIGS. 2A–2C depict the conventional magnetic element during fabrication.
Figure 2B:
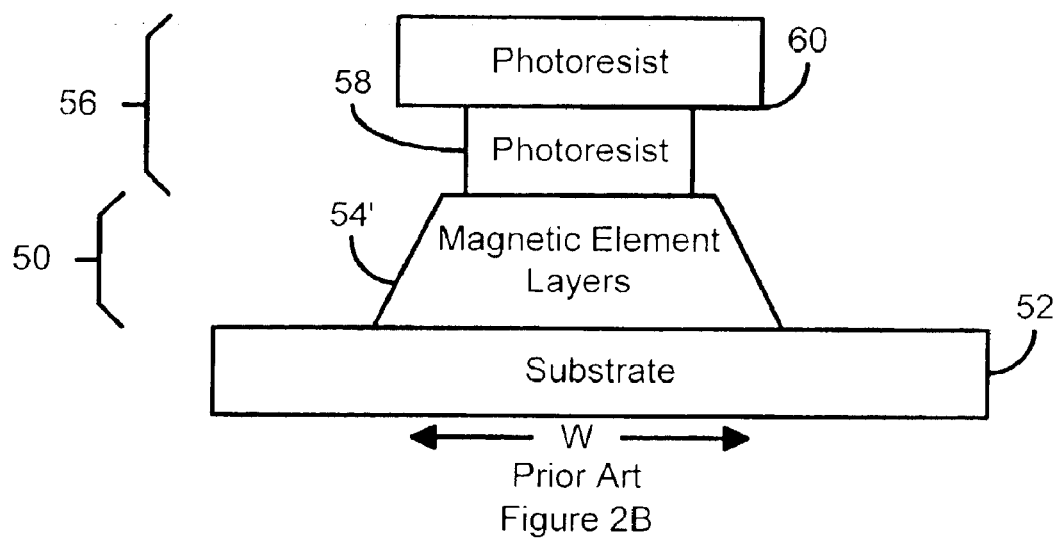
Figure 2C:
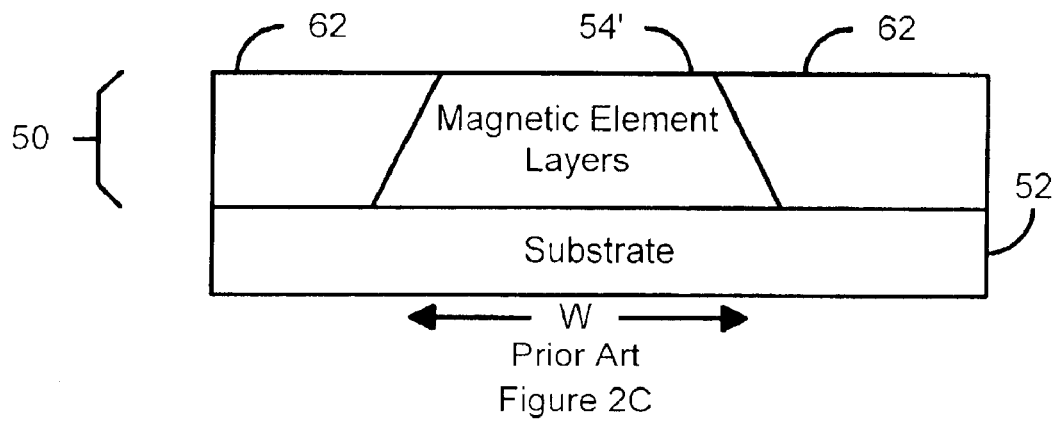

Because of the hard mask, magnetic elements, such as the magnetic elements 70, 80, 90, 90', and some combination of spin valve(s) and/or spin tunneling junction(s), that have smaller widths can be reliably fabricated using the method 100. The hard mask does not lift off or break, which is in contrast to the bilayer photoresist structure 56 depicted in FIGS. 2A and 2B. Consequently, use of the method 100 may allow smaller magnetic elements to be fabricated.

Figure 5B:
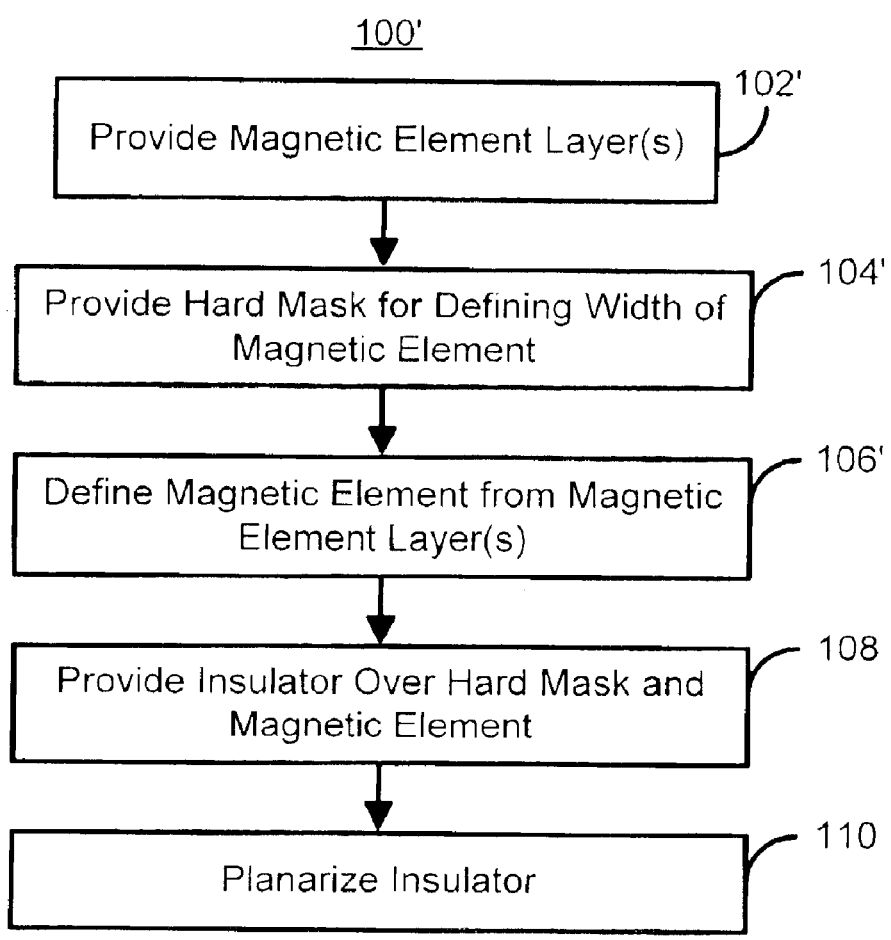
FIG. 5B is a flow chart of one embodiment of a method in accordance with the present invention for providing a magnetic element.

FIG. 5B is a flow chart of one embodiment of a method 100' in accordance with the present invention for providing a magnetic element. The magnetic element layers for the magnetic element are provided, via step 102'. Step 102' is analogous to step 102. Consequently, in a preferred embodiment, the magnetic layers are provided on a seed layer. Also in a preferred embodiment, the magnetic layers are for one or more of the magnetic elements 70, 80, 90, 90', a spin valve, a spin tunneling junction, or some combination thereof. The magnetic layers also preferably include a capping layer. A hard mask is provided on the magnetic layer(s), via step 104'. Step 104' is analogous to step 104. In a preferred embodiment, the hard mask is provided on the capping layer. The capping layer is preferably configured to allow the hard mask to be provided without adversely affecting the layers under the capping layer. In a preferred embodiment, the capping layer also makes it possible to make good electrical contact to the top of the patterned magnetic structure without damaging the magnetic layers. The hard mask is etchable, preferably using an oxygen reactive ion etch. The capping layer is preferably not etchable using oxygen reactive ion etching. Therefore, the hard mask can be defined using photolithography and oxygen reactive ion etching, using photoresist as a mask. The hard mask can also preferably act as a stop layer during a polishing step. The hard mask has a width and depth that is desired for the underlying magnetic element. In a preferred embodiment, the hard mask includes diamond-like carbon (DLC). However, the hard mask could also include other materials having other thicknesses. In a preferred embodiment, the hard mask is has a width, $\lambda'$, described above. Also in a preferred embodiment, the width and depth of the hard mask is less than 0.15 micron. The width and depth of the magnetic element are defined using the hard mask as a mask, via the step 106'. Step 106' is analogous to step 106. Thus, the pattern of the hard mask is transferred to the underlying magnetic element layer(s) in step 106'. In a preferred embodiment, step 106' is performed using an ion mill step. An insulator is provided on the magnetic element and hard mask, via step 108. A planarization step is then performed to planarize the combination of the insulator and the magnetic element, via step 110. Step 110 is thus a polishing step preferably performed using a CMP. Because the hard mask is capable of acting as a stop layer during the CMP, the underlying magnetic element, which was defined in step 106', is not adversely affected by the CMP. Instead, a portion of the hard mask might be removed during the CMP step 110.

Thus, the hard mask provided in step 104' can be made smaller without a liftoff or breakage that often occurs when using a conventional bilayer photoresist structure. In addition, the hard mask can protect the underlying magnetic element during the polishing. As a result, the smaller magnetic element may be more reliably fabricated using the method 100'.

Figure 6:
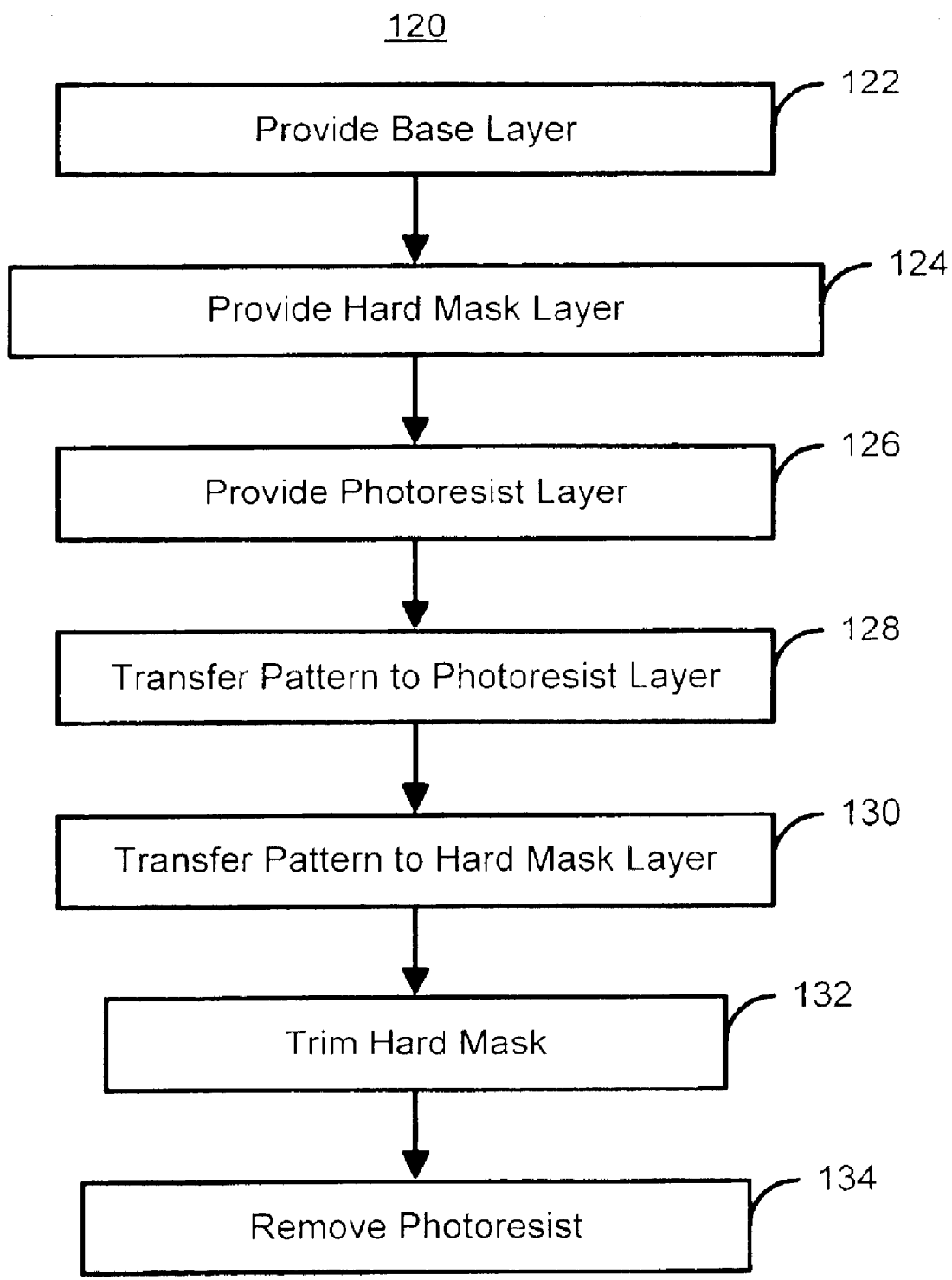
FIG. 6 is a flow chart depicting one embodiment of a method for providing a hard mask for use in fabricating reduced-sized magnetic elements.
Figure 7A:
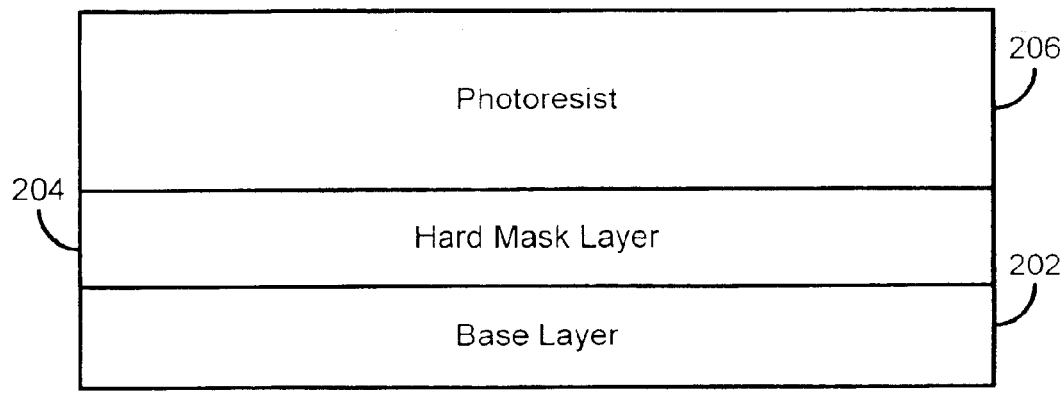
FIGS. 7A–7E depict one embodiment of the hard mask in accordance with the present invention during fabrication.

FIG. 6 is a more detailed flow chart depicting one embodiment of a method 120 for providing a hard mask for use in fabricating reduced-sized magnetic elements. The method 120 is preferably used for the steps 104 and 104' in the methods 100 and 100', respectively. FIGS. 7A–7E depict one embodiment of the hard mask in accordance with the present invention during fabrication using the method 120. A base layer that is insensitive to an etch, described below, used to define the hard mask, is provided, via step 122. The etch used is preferably an oxygen reactive ion etch (RIE). Thus, the base layer is preferably insensitive to an oxygen RIE. In a preferred embodiment, the base layer can be a capping layer provided on the magnetic elements. As described above, the base/capping layer is not substantially etchable during formation of the hard mask. The base layer thus preferably includes metals such as Ta, Pt, or Au. A hard mask layer, preferably DLC, is provided, via step 124. Photoresist is provided on the hard mask layer, via step 126. Preferably, the photoresist is simply spun onto the hard mask layer. FIG. 7A depicts the hard mask layer 204 provided on the base layer 202. Also shown is the photoresist 206.

Figure 7B:
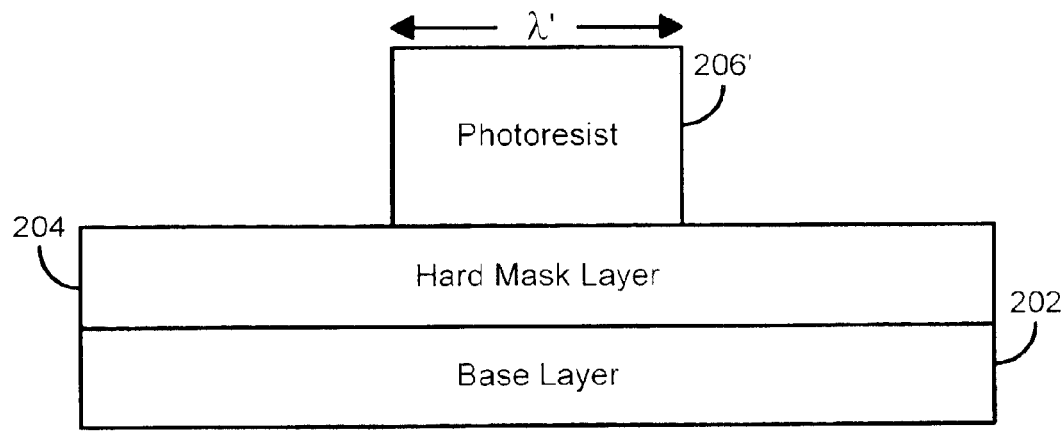
Figure 7C:
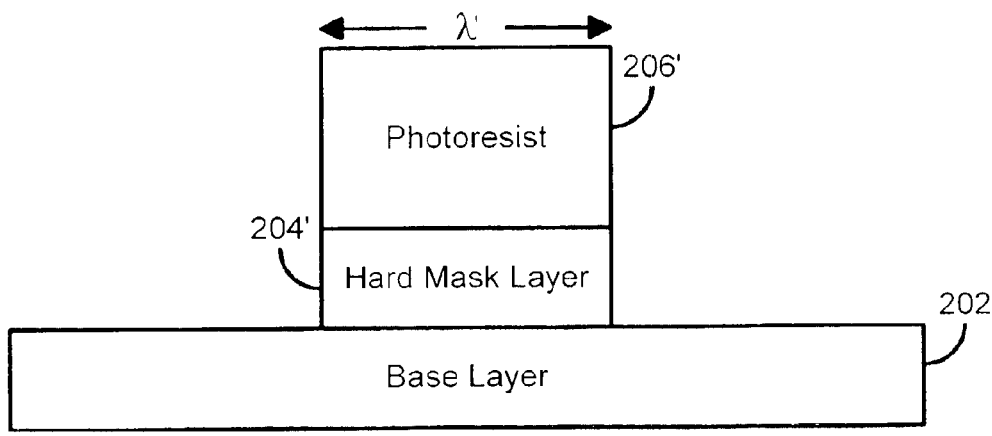
Figure 7D:
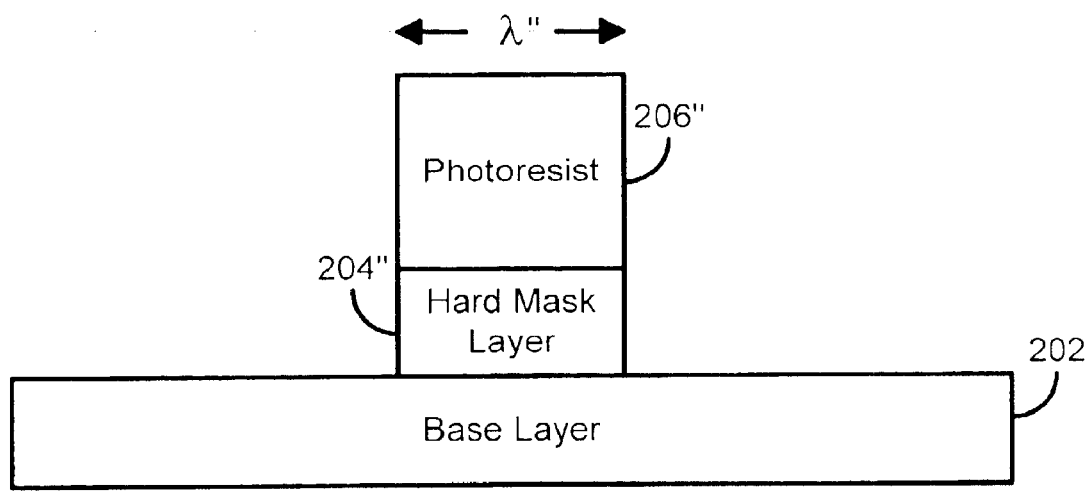
Figure 7E:
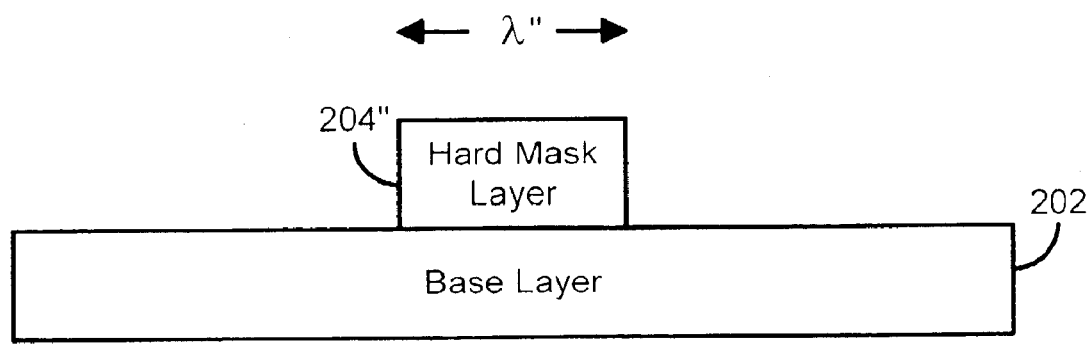

A pattern is then defined for the photoresist layer 206, via step 128. In a preferred embodiment, step 128 is performed using conventional photolithography utilizing light having a wavelength, $\lambda$. FIG. 7B depicts the system after step 128 has been performed. The remaining photoresist 206' has a width of $\lambda'$, the minimum feature size for conventional photolithography utilizing a wavelength $\lambda$. This feature size is chosen because the magnetic element desired to be fabricated using the hard mask is small. However, in an alternate embodiment, the photoresist layer may have another width. The pattern in the photoresist is then transferred to the hard mask layer 204, via step 130. Consequently, the hard mask is defined from the hard mask layer 204 in step 130. Preferably, step 130 is performed using an anisotropic, vertical oxygen RIE step. FIG. 7C depicts the hard mask 204' after step 130 has been completed. Because the etch used in step 130 is preferably anisotropic, the portion of the hard mask layer 204 not covered by the photoresist layer 206' after patterning is removed. In addition, very little of the hard mask layer 204 covered by the photoresist layer 206' is removed during the patterning step 130. As a result, the width of the hard mask 204' is preferably approximately the same as the width, $\lambda'$, of the photoresist 206' prior to the pattern transfer step 130. Furthermore, the base layer 202 is preferably resistant to the oxygen based RIE. Consequently, little of the base layer 202 is removed during the transfer of the pattern in step 130. The hard mask 204' is then trimmed to decrease its width, via step 132. In a preferred embodiment, step 132 is performed using an isotropic oxygen RIE. Thus, now the vertical surfaces are also attacked by the etch performed in step 132. Because of this, and the choice of a base layer 202 that is highly resistant to the oxygen RIE, very little of the base layer 202 is removed during the trim of the hard mask 204'. FIG. 7D depicts the hard mask 204'' and photoresist 206'' after the trim step 132. The width, $\lambda''$, of the photoresist 206'' and the hard mask 204'' is less than the minimum feature size, $\lambda'$, printed using conventional photolithography. The photoresist 206'' is then removed, via step 134. FIG. 7E depicts the hard mask 204'' and underlying base layer after step 134 has been performed. The hard mask 204'' can now be used to define an underlying magnetic element (not shown). Using this hard mask trimming technique, smaller magnetic elements could be defined using conventional photolithography tools. Thus fabrication costs may be reduced and the usable lifetime of conventional photolithography for the definition of magnetic devices, such as magnetic sensors and MRAM, may be extended.

Figure 8:
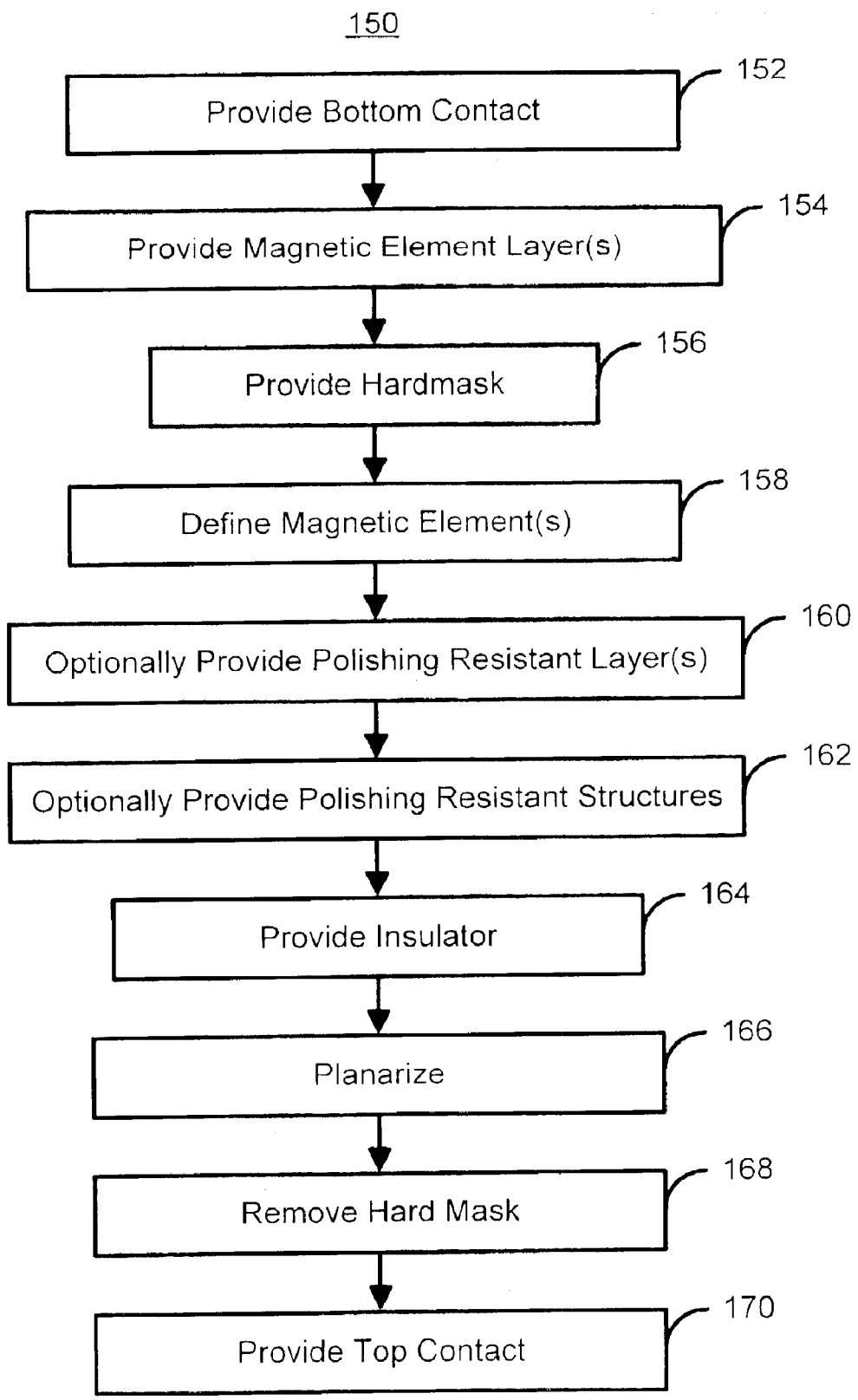
FIG. 8 is a more detailed flow chart of one embodiment of a method in accordance with the present invention for providing a magnetic element.

FIG. 8 is a more detailed flow chart on one embodiment of a method 150 in accordance with the present invention for providing a magnetic element. The method 150 is preferably used in fabricating a magnetic element that will be used in a CPP configuration. For example, the method 150 would be suitable for providing any of the magnetic elements 70, 80, 90 or 90' that utilize spin transfer to switch the magnetization of one or more free layers within the magnetic element. A bottom contact is fabricated, preferably in an underlying layer, via step 152. In a preferred embodiment the contact connects the magnetic element to CMOS based circuitry, which enables one element to be electrically selected from within a dense array.

At least one magnetic element layer is provided, via step 154. In a preferred embodiment, step 154 also includes providing a seed layer underlying the magnetic layers actually used in the magnetic element and at least one capping layer on the magnetic layers used in the magnetic element. For example, if the magnetic element being formed is a dual spin tunnel/valve structure 70, step 154 could include forming an underlying seed layer, the layers 71–76 (AFM 71, pinned layer 72, barrier layer 73, free layer 74, nonmagnetic spacer layer 75, pinned layer 76 and AFM layer 77), and the capping layer, such as the layer 202 depicted in FIG. 7A.

The hard mask is provided on the capping layer, via step 156. In a preferred embodiment, the hard mask is provided using the method 120 depicted in FIG. 6. Referring back to FIG. 8, the magnetic element is defined from the magnetic element layer(s), via step 158. Step 158 is preferably performed using an ion milling step. In some embodiment, additional CMP stop layers (polishing resistant layers), such as $Si_3N_4$, DLC and/or TaN, may optionally be provided, via step 160. However, in alternate embodiments, step 160 may be omitted. In some embodiments, polishing resistant structures, such as $Si_3N_4$ structures or DLC structures, may optionally be provided, via step 162. However, in alternate embodiments, step 162 may be omitted. In another embodiment, the step 162 may be performed prior to the deposition of the magnetic element layers in step 154. Step 162 could include providing a polishing resistant layer, such as a $Si_3N_4$ layer, then etching a trench to leave polishing resistant structures, such as $Si_3N_4$ structures, or posts. Alternatively, step 162 could include providing a mask, then depositing a polishing resistant material, such as $Si_3N_4$ over the region. After removal of the mask, polishing resistant structures remain. In an alternate embodiment, step 162 could be performed prior to step 154, formation of the magnetic element layer(s).

An insulator is provided, via step 164. In yet another embodiment, the step 160 may be incorporated within step 164; such that the provided insulator incorporates a layer of CMP stop material such as $Si_3N_4$, DLC, and/or TaN. A planarizing step is performed, via step 166. Step 166 is a polishing step that, in a preferred embodiment, includes performing a CMP. The CMP is timed to stop at the depth of the CMP resistant material that make up the hard mask as well as the CMP stop layers. The hard mask is removed, via step 168. Thus, the underlying portion of the magnetic layer(s) is exposed. A top contact is then provided, via step 170. Thus, current can flow between the top and bottom contacts, ensuring that current flows in the CPP configuration.

Because the hard mask provided in step 154 can be made smaller without the liftoff or breakage that often occurs when using a conventional bilayer photoresist structure, a smaller magnetic element can be defined. In addition, the hard mask can protect the underlying magnetic element during the CMP. As a result, the smaller magnetic element may be more reliably fabricated using the method 150.

Figure 9A:
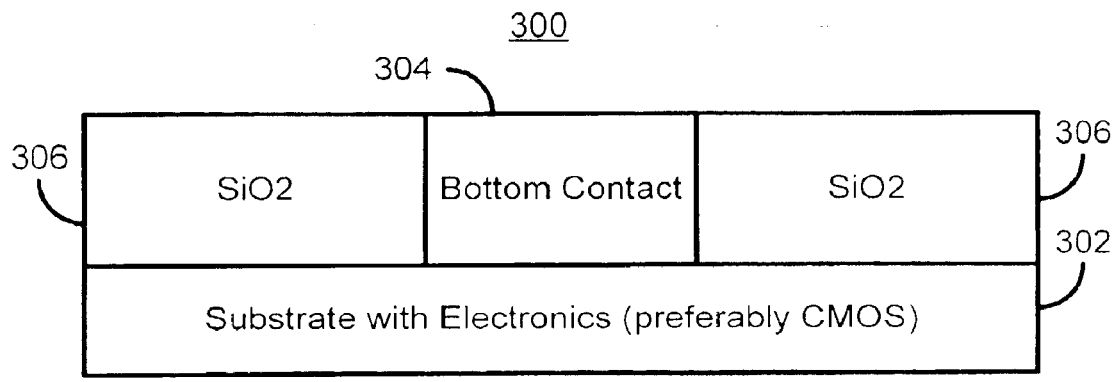
FIGS. 9A–9H depict one embodiment of a magnetic element in accordance with the present invention during fabrication.
Figure 9B:
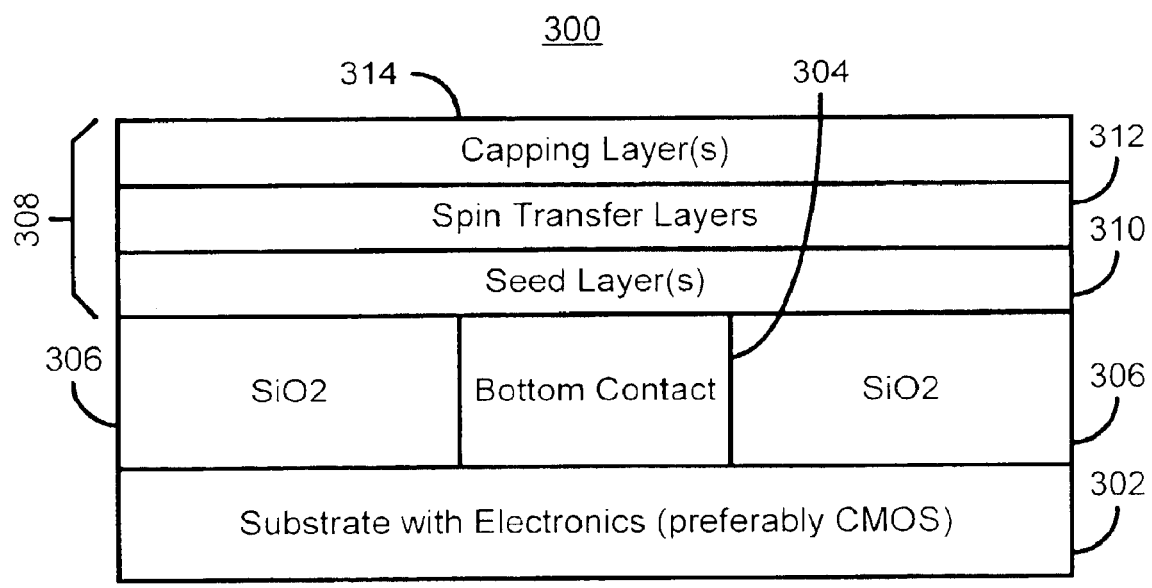
Figure 9C:
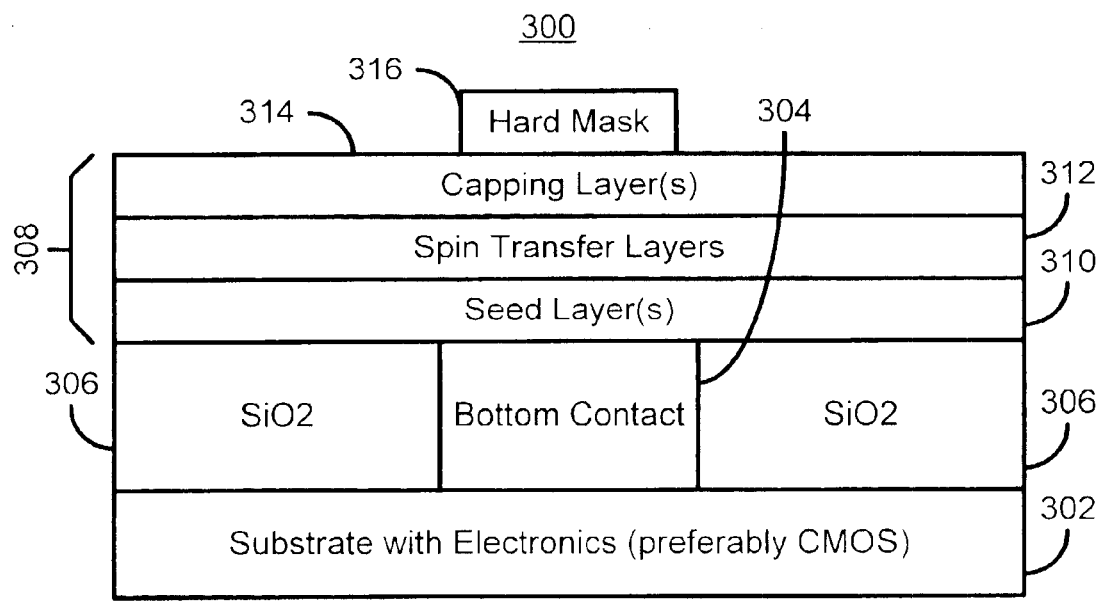

FIGS. 9A–9H depict one embodiment of a system 300 using one embodiment of a magnetic element in accordance with the present invention during fabrication. When completed, the system 300 includes a magnetic element; such as the magnetic elements 70, 80, 90 and 90', that employs the spin transfer phenomenon in order to switch the direction of magnetization of one or more free layers. FIGS. 9A–9H are described in conjunction with the method 150 depicted in FIG. 8. Referring to FIGS. 8 and 9A–H, FIG. 9A depicts the system 300 after step 152, formation of the bottom contact. The system includes substrate 302 having CMOS circuitry. The bottom contact 304 has been formed between insulators 306 that are preferably $SiO_2$. The bottom contact 304 connects the magnetic element to CMOS based circuitry, which enables one element to be electrically selected from within a dense array. The bottom contact can have a larger (or equal) lateral dimension than the patterned magnetic element. FIG. 9B depicts the system 300 after formation of the magnetic element layers 308 in step 154. Thus, the seed layer 310, the spin transfer layers 312 and the capping layer 314 are depicted. The spin transfer layers 312 include the layers such as those described in the magnetic elements 70, 80, 90, and 90'. The capping layer 314 is preferably the same as the base layer 202 described in FIGS. 7A–7E.

Referring back to FIGS. 8 and 9A–H, FIG. 9C depicts the system 300 after the hard mask 316 has been provided in step 156. The hard mask 316 is preferably provided using the method 120 described in FIGS. 6 and 7A–7E. Consequently, the hard mask 316 can be etched to define the hard mask 316, but is resistant to the process used to define the magnetic element and acts as a stop layer during planarization of the system 300. In other words, compared to the materials used in the insulating layers, preferably $SiO_2$ or $Al_2O_3$, the hard mask 316 is polishing resistant. In a preferred embodiment, the hard mask 316 includes DLC. However, other suitable materials could be used.

Figure 9D:
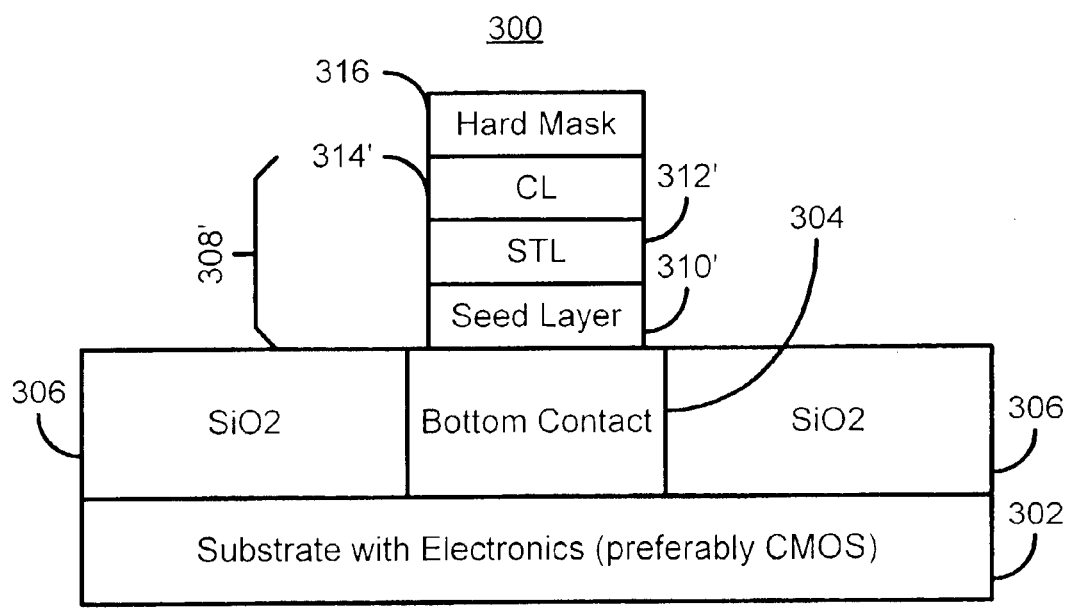
Figure 9E:
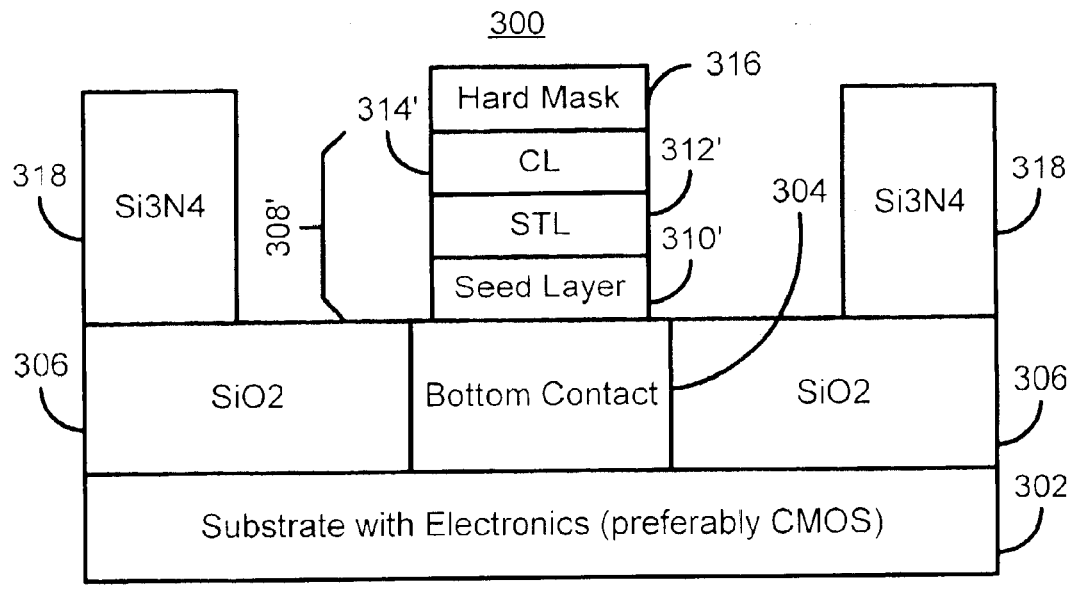

FIG. 9D depicts the system 300 after step 158, defining the magnetic element 308'. Thus, the magnetic element 308' now has a small width. In a preferred embodiment, the width and length of the magnetic element 308' is less than or equal to 0.15 micron and can be smaller than the minimum feature size of conventional photolithography alone. FIG. 9E depicts the system 300 after polishing resistant structures 318, preferably $Si_3N_4$ or DLC, have been provided in step 162. Thus, the magnetic element 308' lies a recessed region formed between the $Si_3N_4$ structures 318. The polishing resistant structures 318 aid in stopping the planarization in regions around the magnetic element 308'.

Figure 9F:
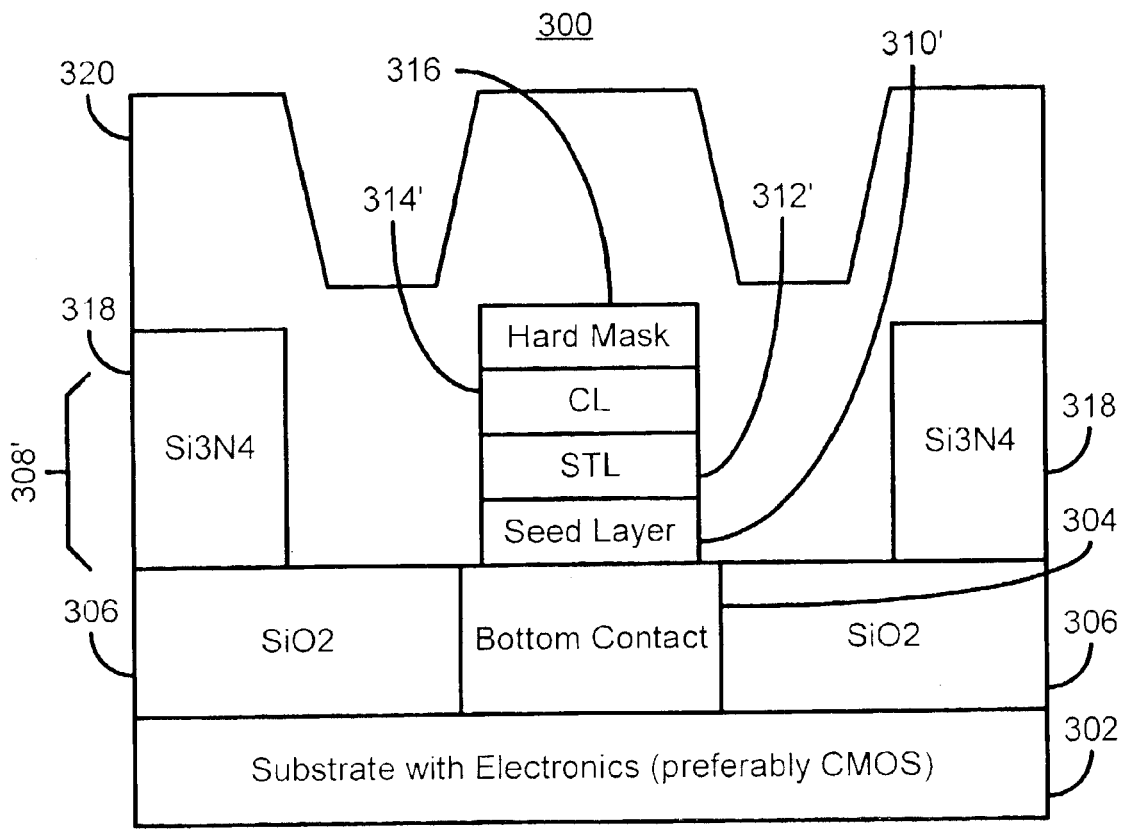
Figure 9G:
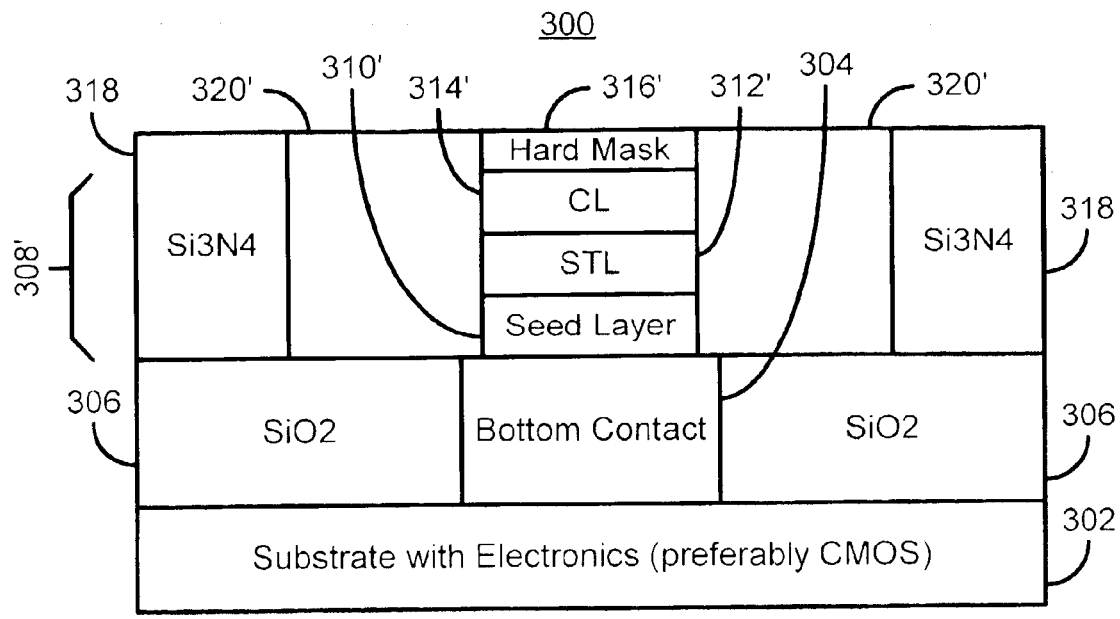
Figure 9H:
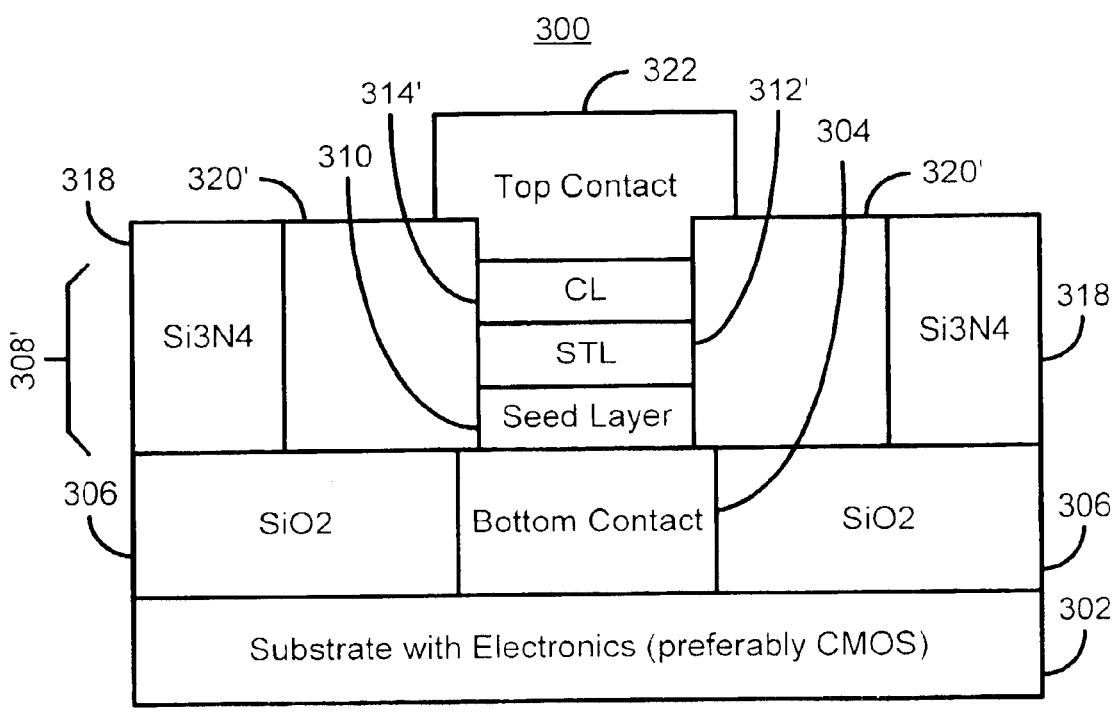

FIG. 9F depicts the system 300 after an insulator 320 has been deposited in step 164. The insulating layer 320 preferably fills the gaps between the $Si_3N_4$ structures 318 and the magnetic element 308'. However, note that the top surface of the insulator 320 varies greatly in height. Consequently, the insulator 320 is planarized in order to allow making electrical contact to the magnetic element. FIG. 9G depicts the system 300 after planarization has been performed in step 166. The combination of the $Si_3N_4$ structures 318 and the hard mask 316' act as a CMP stop layer. As a result, only a portion of the hard masks 316' has been removed. Consequently, the underlying layers, including the magnetic element 308' are protected during the CMP. Also, compared to the system 500 (described below) for low density hard mask arrays, the $Si_3N_4$ structures 318 can lead to lower electrical shorting problems than in the system 500. This additional benefit is achieved because once the CMP stop has been uncovered, the CMP rate is greater for distances away from the CMP stop structure. This disparity in CMP rate can lead to the uncovering the bottom contacts 304 in lower density hard mask arrays. FIG. 9H depicts the system 300 after the hard mask 316' has been removed in step 168 and the top contact 322 has been provided in step 170.

Thus, current can be driven in a CPP configuration between the bottom contact 304 and the top contact 322. Because of the use of the hard mask 316, the magnetic element 308' has a smaller width and has been protected from damage during planarization. Consequently, a smaller magnetic element 308' may be reliably fabricated. Because the magnetic element 308' has a smaller width, memories made of up arrays of the magnetic element 308' having a higher density can be reliably fabricated. In addition, because the magnetic element 308' has been made smaller, a smaller current may be used for writing of the magnetic element 308' while ensuring that a sufficient current density exists for spin transfer to write to the magnetic element 308'. Performance and reliability of the magnetic element 308' may thus be improved.

Figure 10A:
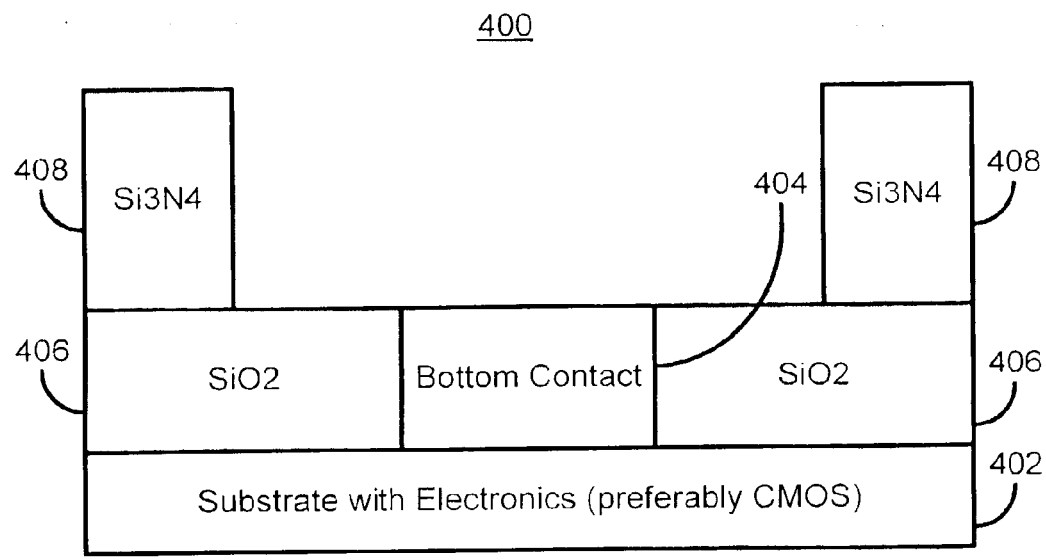
FIGS. 10A–10G depict a second embodiment of a magnetic element in accordance with the present invention during fabrication.
Figure 10B:
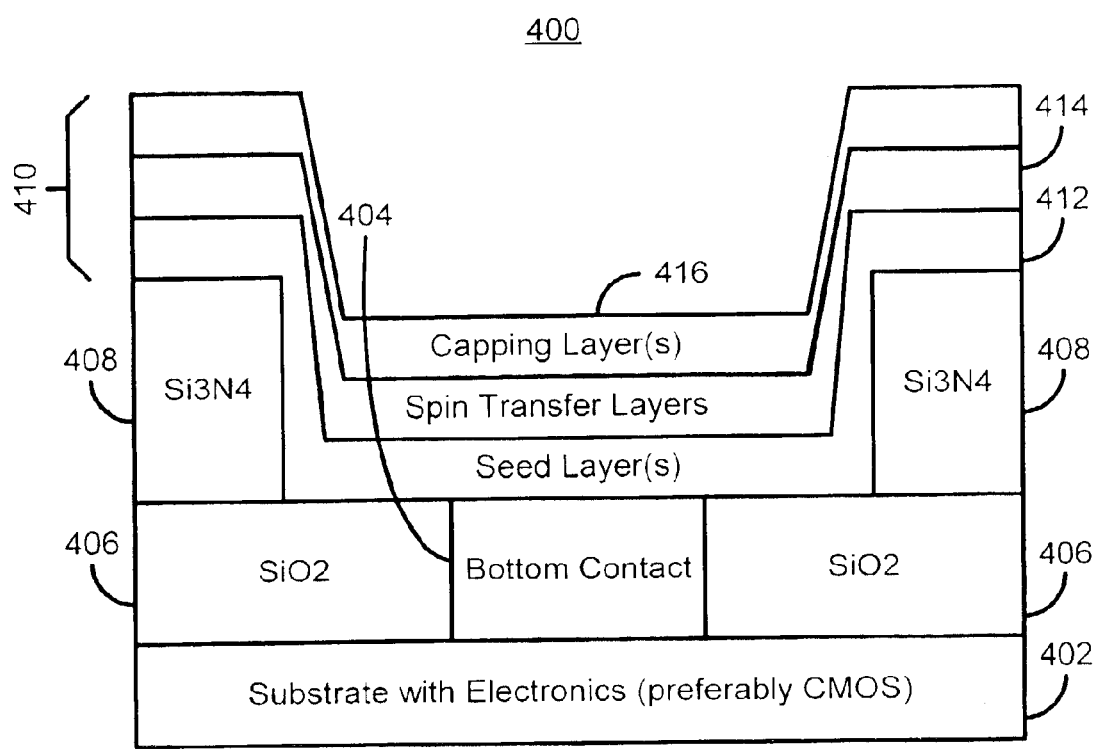
Figure 10C:
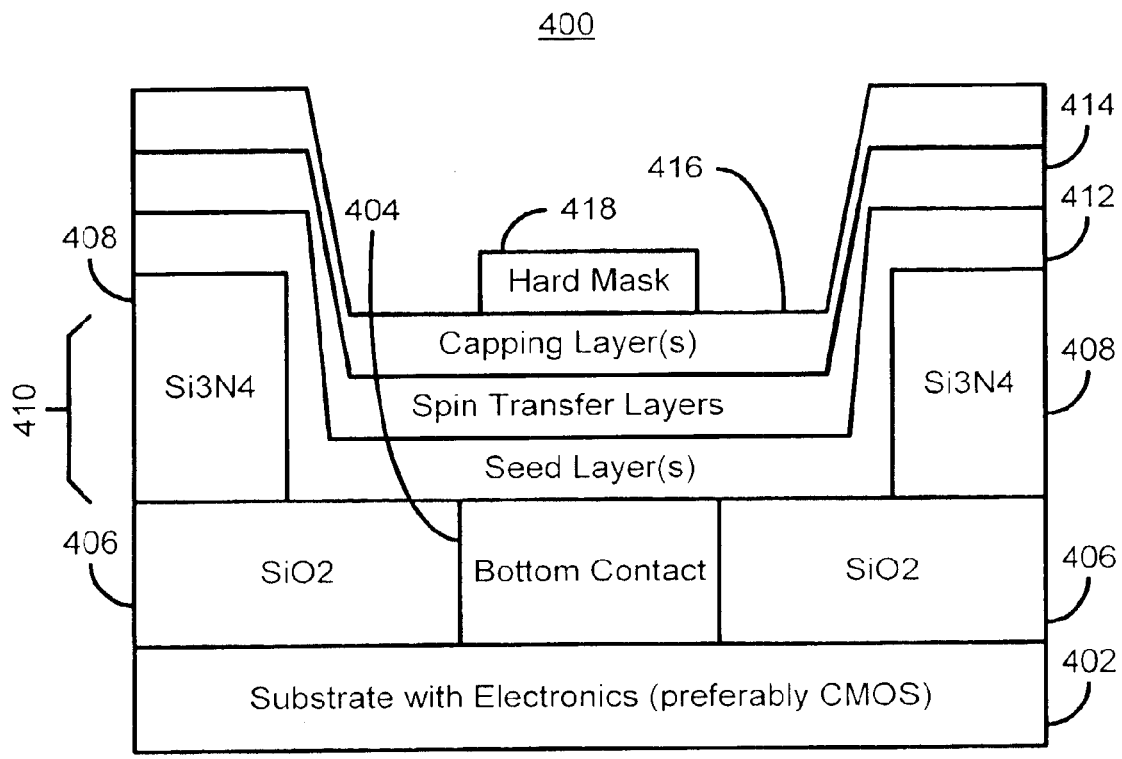

FIGS. 10A–10G depict a second embodiment of system 400 including one embodiment of a magnetic element in accordance with the present invention during fabrication. When completed, the system 400 includes a magnetic element; such as the magnetic elements 70, 80, 90 and 90'; that employs the spin transfer phenomenon in order to switch the direction of magnetization of one or more free layers. FIGS. 10A–10G are described in conjunction with the method 150 depicted in FIG. 8. Referring to FIGS. 8 and 10A–G, FIG. 10A depicts the system 400 after step 152, formation of the bottom contact. The system includes substrate 402 having CMOS circuitry. The bottom contact 404 has been formed between insulators 406 that are preferably $SiO_2$. The bottom contact 404 connects the magnetic element to CMOS based circuitry, which enables one element to be electrically selected from within a dense array. Also depicted are polishing resistant structures 408, such as $Si_3N_4$ structures. The $Si_3N_4$ structures 408 are thus formed prior to the deposition of the magnetic element layers (not shown). The polishing resistant structures 408 are preferably formed by providing a polishing resistant layer, such as a $Si_3N_4$ layer, and etching a trench in the layer or by deposition of a polishing resistant material, such as $Si_3N_4$, while a mask covers a region above the bottom contact 404. The polishing resistant structures 408 aid in stopping the planarization in regions around the magnetic element FIG. 10B depicts the system 400 after formation of the magnetic element layers 410 in step 154. Thus, the seed layer 412, the spin transfer layers 414 and the capping layer 416 are depicted. The spin transfer layers 414 include the layers such as those described in the magnetic elements 70, 80, 90, and 90'. The capping layer 416 is preferably the same as the base layer 202 described in FIGS. 7A–7E.

Referring back to FIGS. 8 and 10A–F, FIG. 10C depicts the system 400 after the hard mask 418 has been provided in step 156. The hard mask 418 is preferably provided using the method 120 described in FIGS. 6 and 7A–7E. Consequently, the hard mask 418 can be etched during an etch used to define the hard mask 418, but is resistant to the process used to define the magnetic element and acts as a stop layer during planarization of the system 400. In other words, compared to the materials used in the insulating layers, preferably $SiO_2$ or $Al_2O_3$, the hard mask 418 is polishing resistant. In a preferred embodiment, the hard mask 418 includes DLC. However, other suitable materials could be used.

Figure 10D:
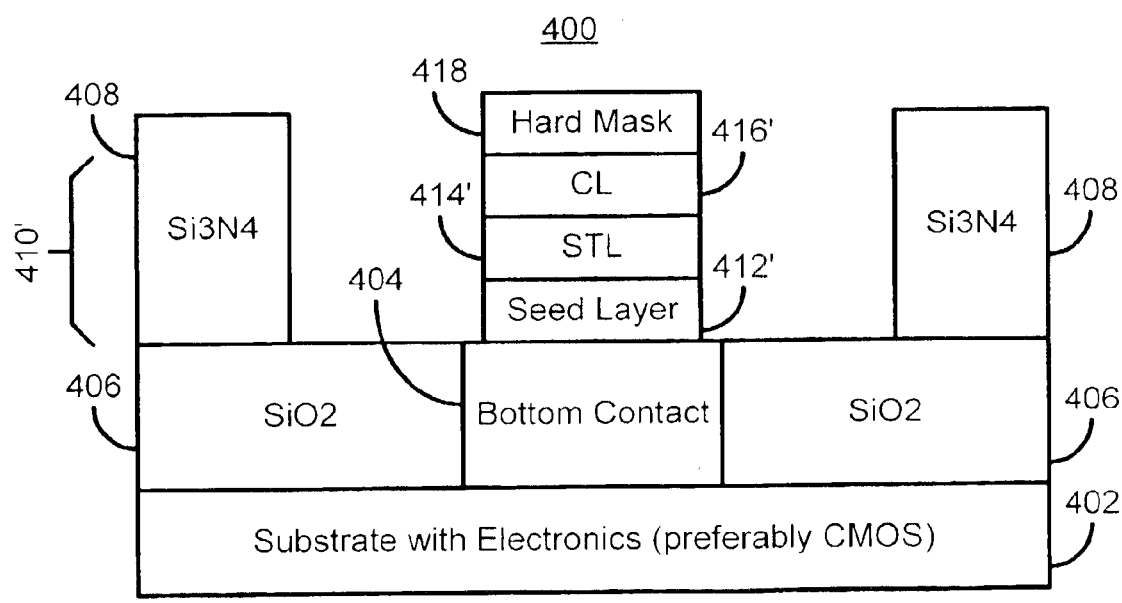
Figure 10E:
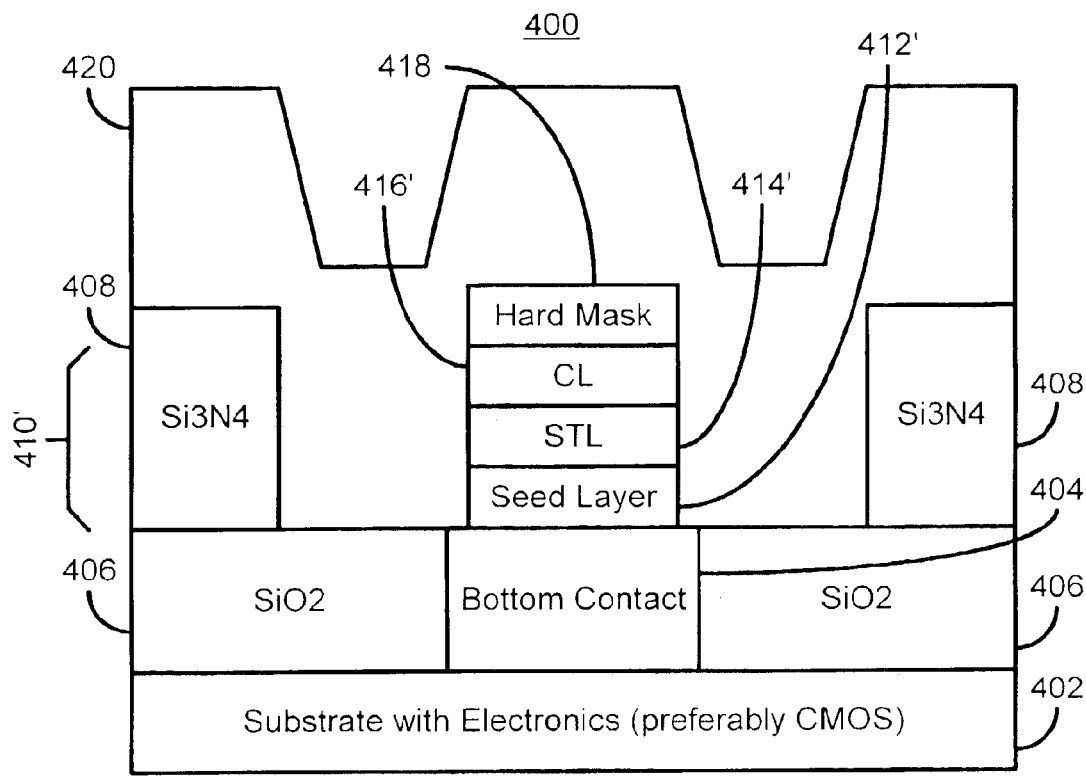
Figure 10F:
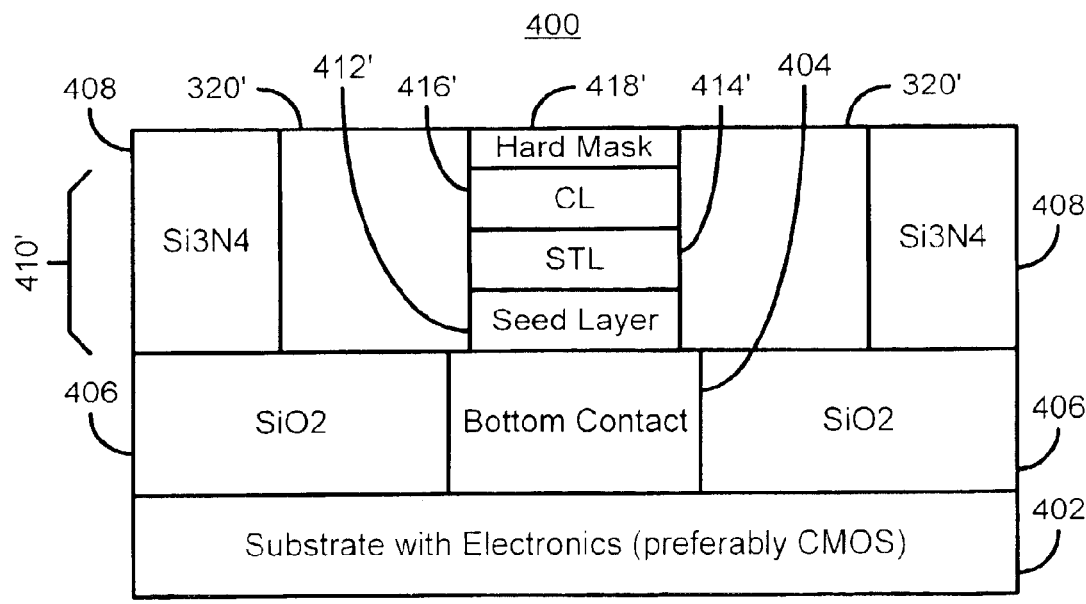
Figure 10G:
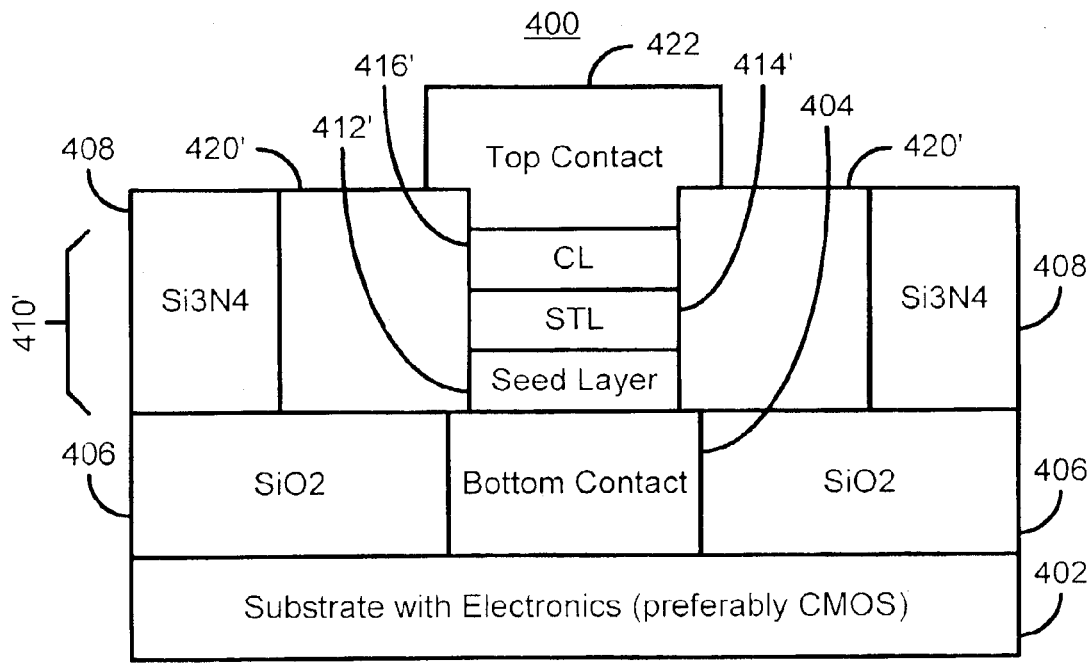

FIG. 10D depicts the system 400 after step 158, defining the magnetic element 410'. Thus, the magnetic element 410' now has a small width. In a preferred embodiment, the width of the magnetic element 410' is less than or equal to 0.15 micron and can be smaller than the minimum feature size of conventional photolithography alone. FIG. 10E depicts the system 400 after an insulator 420 has been deposited in step 164. The insulating layer 420 preferably fills the gaps between the $Si_3N_4$ structures 408 and the magnetic element 410'. However, note that the top surface of the insulator 420 varies greatly in height. Consequently, the insulator 420 is planarized in order to allow making electrical contact to the magnetic element. FIG. 10F depicts the system 400 after planarization has been performed in step 166. The $Si_3N_4$ structures 408 have been exposed and the top surface of the $Si_3N_4$ structures 408 and the insulator 420 are planar. The combination of the $Si_3N_4$ structures 408 and the hard mask 418' act as a polishing stop layer. As a result, only a portion of the hard mask 418' has been removed. Consequently, the underlying layers, including the magnetic element 410' are protected during the polishing. Also, compared to the system 500 (described below) for low density hard mask arrays, the $Si_3N_4$ structures 408 can lead to lower electrical shorting problems than in the system 500. This additional benefit is achieved because once the polishing stop has been uncovered, the polishing rate is greater for distances away from the polishing stop structure. This disparity in polishing rate can lead to the uncovering the bottom contacts 404 in lower density hard mask arrays. FIG. 10G depicts the system 400 after the hard mask 418' has been removed in step 168 and the top contact 422 has been provided in step 170.

Thus, current can be driven in a CPP configuration between the bottom contact 404 and the top contact 422. Because of the use of the hard mask 418, the magnetic element 410' has a smaller width and has been protected from damage during planarization. Consequently, a smaller magnetic element 410' may be reliably fabricated. Because the magnetic element 410' has a smaller width, memories made of up arrays of the magnetic element 410' having a higher density may also be reliably fabricated. In addition, because the magnetic element 410' has been smaller, a smaller current may be used for writing of the magnetic element 410' while ensuring that a sufficient current density exists for spin transfer to write to the magnetic element 410'. Performance and reliability of the magnetic element 410' may thus be improved.

Figure 11A:
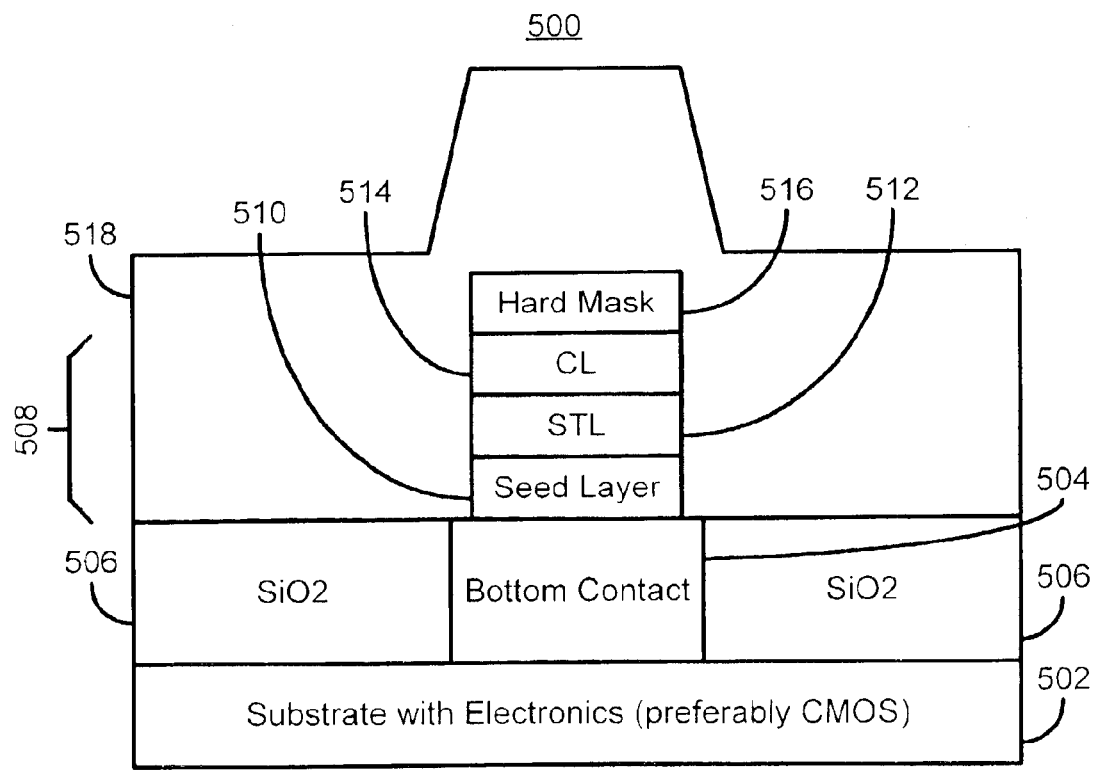
FIGS. 11A–11C depict a third embodiment of a magnetic element in accordance with the present invention during fabrication.
Figure 11B:
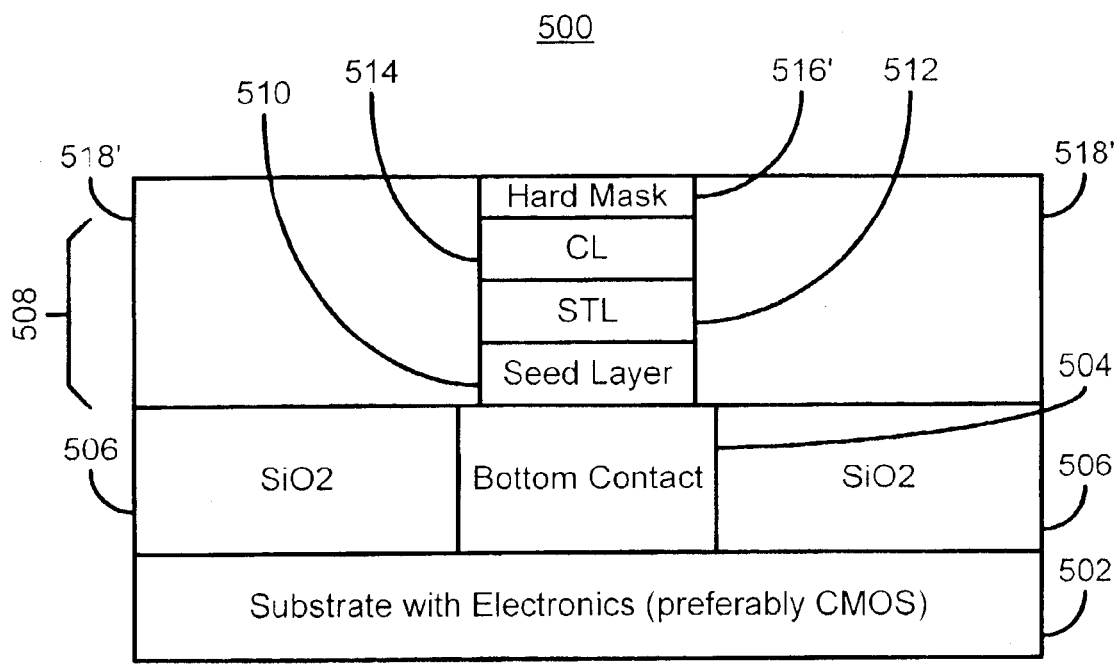
Figure 11C:
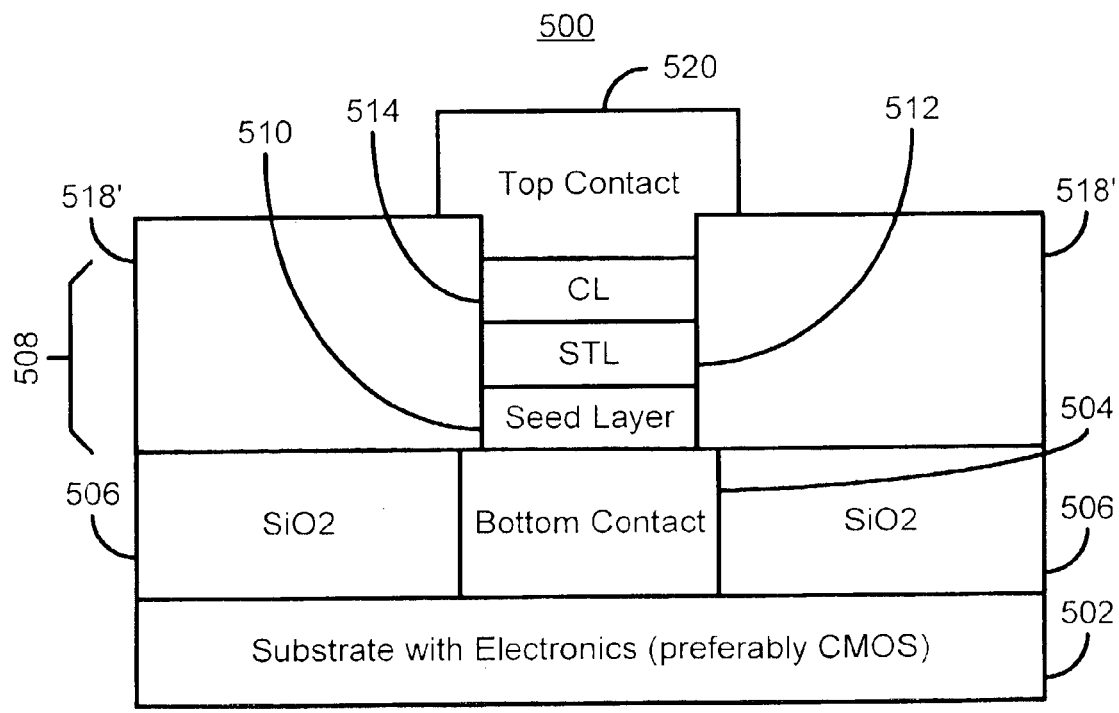

FIGS. 11A–11C depict a third embodiment of system 500 including one embodiment of a magnetic element in accordance with the present invention during fabrication. When completed, the system 500 includes a magnetic element; such as the magnetic elements 70, 80, 90 and 90'; that employs the spin transfer phenomenon to switch the direction of magnetization of one or more free layers. FIGS. 11A–11C are described in conjunction with the method 150 depicted in FIG. 8. Referring to FIGS. 8 and 11A–C. The system 500 does not include $Si_3N_4$, or polishing resistant structures. Consequently, the system 500 resembles the system 300 until after the magnetic element is defined in step 158. Thus, 11A depicts the system after the insulator has been deposited in step 164, with step 162 being omitted. The system 500 includes a substrate 502 having CMOS circuitry. The bottom contact 504 has been formed between insulators 506 that are preferably $SiO_2$. The bottom contact 504 connects the magnetic element to CMOS based circuitry, which enables one element to be electrically selected from within a dense array. The magnetic element 508 includes a seed layer 510, spin transfer layers 512 and a capping layer 514. The spin transfer layers 512 include the layers such as those described in the magnetic elements 70, 80, 90, and 90'. The capping layer 514 is preferably the same as the base layer 202 described in FIGS. 7A–7E. The system also includes a hard mask 516 and an insulator 518. The hard mask 516 is preferably provided using the method 120 described in FIGS. 6 and 7A–7E. Consequently, the hard mask 516 can be etched to define the hard mask 516, but is resistant to the process used to define the magnetic element and acts as a stop layer during planarization of the system 500. In other words, compared to the materials used in the insulating layers, preferably $SiO_2$ or $Al_2O_3$, the hard mask 516 is polishing resistant. In a preferred embodiment, the hard mask 516 includes DLC. However, other suitable materials could be used. Because of the use of the hard mask during the magnetic element defining step 158, the magnetic element 508 has a small width. In a preferred embodiment, the width of the magnetic element 508 is less than 0.15 micron and can be smaller than the minimum feature size of conventional photolithography alone. The insulator 518 has been deposited in step 162. However, note that the top surface of the insulator 518 varies greatly in height. Consequently, the insulator 518 is planarized in order to allow making electrical contact to the magnetic element.

FIG. 11B depicts the system 500 after planarization has been performed in step 166. The top surface of the insulator 518' and polishing resistant layer 516' are planar. In addition, because the hard mask 516 acts as a stop layer, only a portion of the hard mask 516 has been removed leaving a modified hard mask 516'. Consequently, the underlying layers, including the magnetic element 508 are protected during the CMP. FIG. 11C depicts the system 500 after the hard mask 516' has been removed and the top contact 520 has been provided in step 170. The system 500 functions. However, as described above, the systems 300 and 400 share the additional advantage that shorting between contacts may be less likely. This is because although the hard mask layer 516 is capable of acting as a polishing stop layer, the polishing step may still polish regions away from the hard mask 516. In other words, the use of the hard mask layer 516 alone as a stop layer makes it more probable that some of the bottom contact 504 will be exposed during the planarization in step 166. Thus, it is more likely that the top contact 520 will be shorted to the bottom contact 504. However, use of the system 500 may still repeatably provide smaller magnetic elements 508 and this problem may be relieved when element density is high.

Thus, current can be driven in a CPP configuration between the bottom contact 504 and the top contact 520. Because of the use of the hard mask 516, the magnetic element 508 has a smaller width and has been protected from damage during planarization. Consequently, a smaller magnetic element 508 may be reliably fabricated. Because the magnetic element 508 has a smaller width, memories made of up arrays of the magnetic element 508 having a higher density may also be reliably fabricated. In addition, because the magnetic element 508 has been made smaller, a smaller current may be used for writing of the magnetic element 508 while ensuring that a sufficient current density exists for spin transfer to write to the magnetic element 508. Performance and reliability of the magnetic element 508 may thus be improved.

Figure 12A:
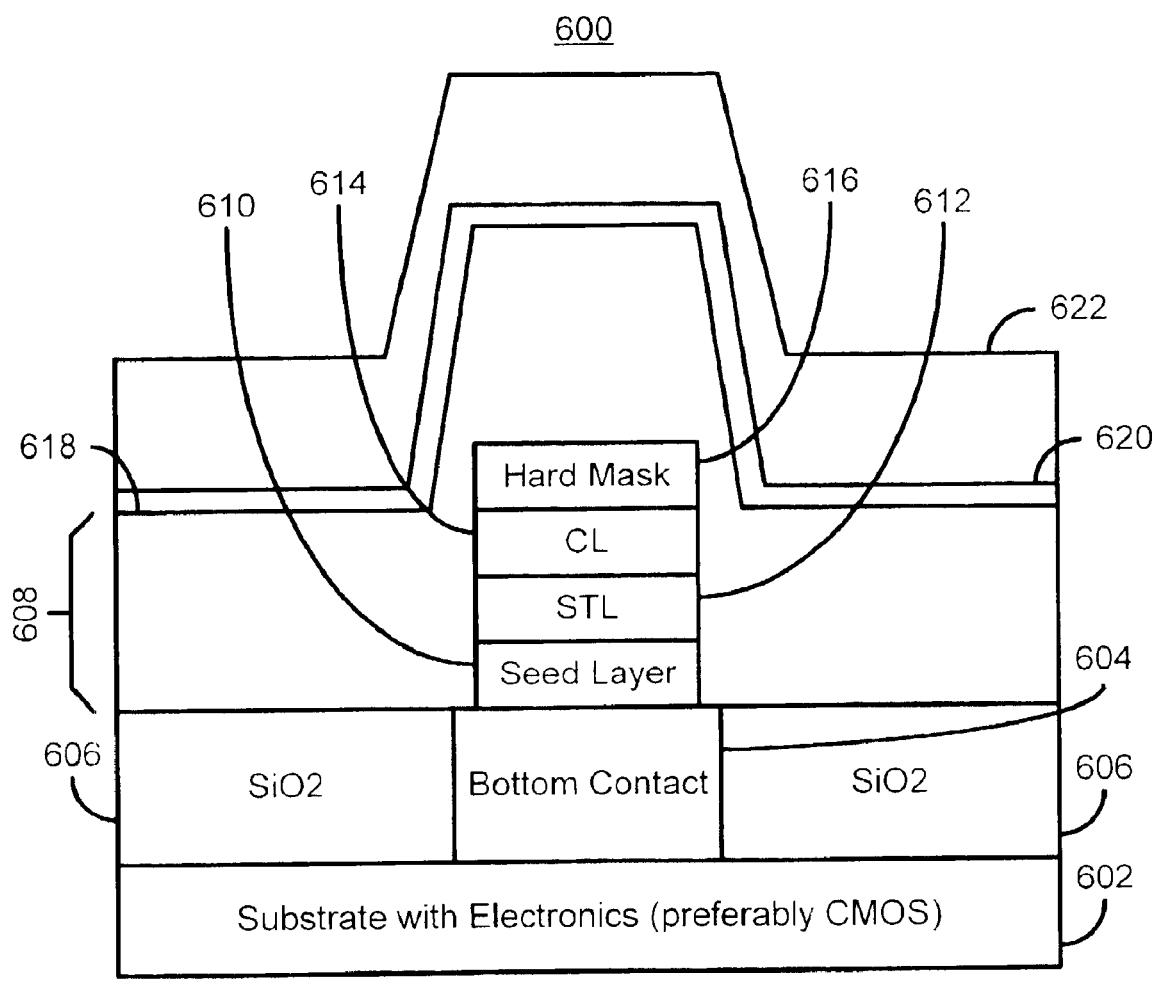
FIGS. 12A–12C depict a fourth embodiment of a magnetic element in accordance with the present invention during fabrication.
Figure 12B:
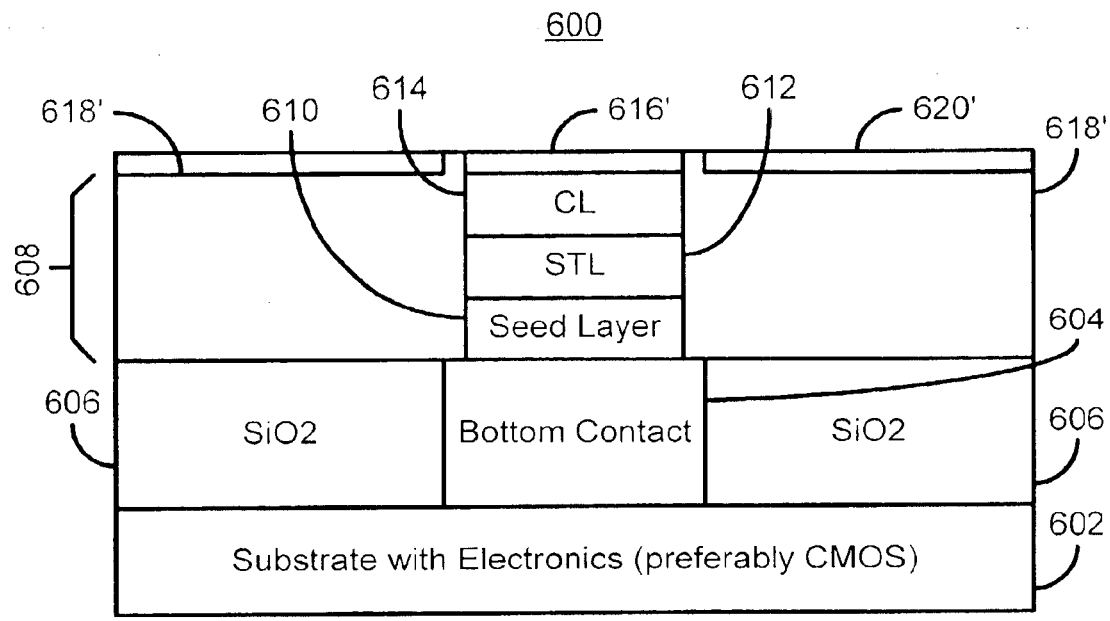
Figure 12C:
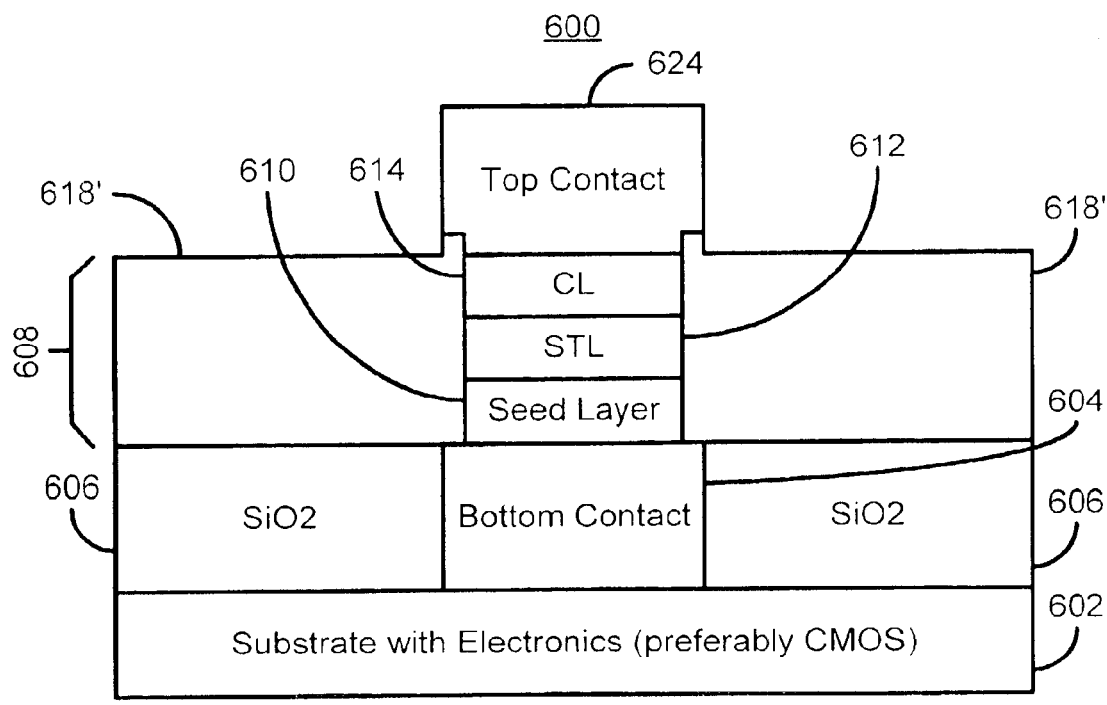

FIGS. 12A–12C depict a fourth embodiment of system 600 including one embodiment of a magnetic element in accordance with the present invention during fabrication. When completed, the system 600 includes a magnetic element, such as the magnetic elements 70, 80, 90 and 90', that employs the spin transfer phenomenon in order to switch the direction of magnetization of one or more free layers. FIGS. 12A–12C are described in conjunction with the method 150 depicted in FIG. 8. Referring to FIGS. 8 and 12A–C. The system 600 does not include polishing resistant structures. Consequently, the system 600 resembles the system 300 until after the magnetic element is defined in step 158. Thus, 12A depicts the system after the insulator has been deposited in step 164, with step 162 being omitted. However, the step 164 that formed the insulator also includes forming a polishing resistant layer.

Thus, the system 600 includes a substrate 602 having CMOS circuitry. The bottom contact 604 has been formed between insulators 606 that are preferably $SiO_2$. The bottom contact 604 connects the magnetic element to CMOS based circuitry, which enables one element to be electrically selected from within a dense array. The magnetic element 608 includes a seed layer 610, spin transfer layers 612 and a capping layer 614. The spin transfer layers 612 include the layers such as those described in the magnetic elements 70, 80, 90, and 90'. The capping layer 614 is preferably the same as the base layer 202 described in FIGS. 7A–7E. The system also includes a hard mask 616. The hard mask 616 is preferably provided using the method 120 described in FIGS. 6 and 7A–7E. Consequently, the hard mask 616 can be etched to define the hard mask 616, but is resistant to the process used to define the magnetic element and, in a preferred embodiment, acts as a stop layer during planarization of the system 600. In other words, compared to the materials used in the insulating layers, preferably $SiO_2$ or $Al_2O_3$, the hard mask 616 is polishing resistant. In a preferred embodiment, the hard mask 616 includes DLC. However, other suitable materials could be used. Because of the use of the hard mask during the magnetic element defining step 158, the magnetic element 608 has a small width. In a preferred embodiment, the width of the magnetic element 608 is less than or equal to 0.15 micron and can be smaller than the minimum feature size of conventional photolithography alone.

The system 600 also includes a first insulator 618, a polishing resistant layer 620 and a second insulator 622. Thus, the step 164 includes providing not only insulators 618 and 622, but also incorporates step 160 of providing a polishing resistant layer 620. The insulator 618 has been deposited in step 162. In addition, note that the top surface of the insulators 618 and 620 varies greatly in height. Consequently, the insulator 618 is planarized in order to allow making electrical contact to the magnetic element.

FIG. 12B depicts the system 600 after planarization has been performed in step 166. The top surface of the insulator 618' and polishing resistant layer 620' are planar. In addition, because the hard mask 616 acts as a stop layer, only a portion of the hard mask 616' has been removed. Consequently, the underlying layers, including the magnetic element 608 are protected during the CMP. FIG. 12C depicts the system 600 after the hard mask 616' has been removed and the top contact 624 has been provided in step 170. The system 600 utilizes the additional polishing resistant layer 620. Consequently, polishing of regions away from the magnetic element 608 can be controlled. Thus, it is less probable that some of the bottom contact 604 will be exposed during the planarization in step 166. Thus, it is less likely that the top contact 624 will be shortened to the bottom contact 604. In addition, the system 600 can still repeatably provide smaller magnetic elements 608.

Thus, current can be driven in a CPP configuration between the bottom contact 604 and the top contact 624. Because of the use of the hard mask 616, the magnetic element 608 has a smaller width and may be protected from damage during planarization. Consequently, a smaller magnetic element 608 may be reliably fabricated. Because the magnetic element 608 has a smaller width, memories made of up arrays of the magnetic element 608 having a higher density may be reliably fabricated. In addition, because the magnetic element 608 has been made smaller, a smaller current may be used for writing of the magnetic element 608 while ensuring that a sufficient current density exists for spin transfer to write to the magnetic element 608. Performance and reliability of the magnetic element 608 may thus be improved.

A method and system has been disclosed for reliably providing smaller magnetic elements. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for providing a magnetic element comprising:

providing at least one magnetic element layer;

providing a hard mask structure for masking a portion of the at least one magnetic element layer, the hard mask being formed from at least one hard mask material, the at least one hard mask material being etchable for definition of the hard mask structure, the hard mask structure acting as a mask during definition of a width of the magnetic element, the hard mask structure being a diamond-like carbon structure;

defining the width of the magnetic element by removing a portion of the at least one magnetic element layer using the hard mask structure as a mask.

2. The method of claim 1 further comprising:

providing a polishing resistant layer; and providing an insulator.

3. The method of claim 1 wherein the hard mask structure further acts as a stop layer during a chemical mechanical (CMP) step and wherein the method further includes:

providing an insulator after the width of the magnetic element has been defined; and performing the CMP step using the hard mask structure as a stop layer above the magnetic element.

4. The method of claim 1 further comprising:

providing a bottom contact under the at least one magnetic element layer.

5. The method of claim 4 wherein the magnetic element is used in conjunction with CMOS circuitry.

6. The method of claim 1 wherein the at least one magnetic layer providing step further includes:

providing a spin tunneling junction having a first free layer;

providing at least one spin valve having a second free layer, the first free layer and the second free layer being magnetostatically coupled.

7. The method of claim 1 wherein the width-defining step further includes:

(c1) defining the width of the magnetic element to be less than or equal to 0.15 micron.

8. A method for providing a magnetic element comprising:

providing at least one magnetic element layer;

providing a hard mask structure for masking a portion of the at least one magnetic element layer, the hard mask being formed from at least one hard mask material, the at least one hard mask material being etchable for definition of the hard mask structure, the hard mask structure acting as a mask during definition of a width of the magnetic element;

defining the width of the magnetic element by removing a portion of the at least one magnetic element layer using the hard mask structure as a mask; and wherein the hard mask structure providing step further includes:

providing a hard mask layer on the capping layer, the capping layer residing on a layer of the at least one magnetic element layer, the capping layer being resistant to an etch that defines the hard mask structure;

providing a photoresist structure on the hard mask layer, the photoresist structure having a width;

anisotropically etching the hard mask layer using the photoresist structure as a mask, the hard mask layer having a first width after being anisotropically etched;

trimming the hard mask layer to have a second width that is less than the first width; and removing the photoresist structure after the hard mask layer has been trimmed.

9. A method for providing a magnetic element comprising:

providing at least one magnetic element layer;

providing a hard mask structure for masking a portion of the at least one magnetic element layer, the hard mask being formed from at least one hard mask material, the at least one hard mask material being etchable for definition of the hard mask structure, the hard mask structure acting as a mask during definition of a width of the magnetic element;

defining the width of the magnetic element by removing a portion of the at least one magnetic element layer using the hard mask structure as a mask; and providing a plurality of polishing resistant structures, the plurality of polishing resistant structures having a recessed region therebetween.

10. The method of claim 9 wherein the polishing resistant structure providing step further includes:

providing a polishing resistant layer; and etching at least one trench in the polishing resistant layer to provide the recessed region.

11. The method of claim 9 wherein the polishing resistant structure providing step further includes:

providing the plurality of polishing resistant posts, the plurality of polishing resistant posts having the recessed region therebetween.

12. The method of claim 9 wherein the plurality of polishing resistant structures include diamond like carbon, $Si_3N_4$, and/or TaN.

13. A method for providing a magnetic element comprising the steps of:

providing at least one magnetic element layer;

providing a hard mask structure for masking a portion of the at least one magnetic element layer, the hard mask being formed from at least one hard mask material, the at least one hard mask material being etchable for definition of the hard mask structure, the hard mask structure acting as a mask during definition of a width of the magnetic element;

defining the width of the magnetic element by removing a portion of the at least one magnetic element layer using the hard mask structure as a mask;

wherein at least one magnetic layer providing step further includes:

providing a dual spin tunnel/valve structure;

providing a capping layer on the dual spin tunnel/valve structure.

* * * * *